United States Patent
Seong et al.

(10) Patent No.: US 11,514,971 B2
(45) Date of Patent: Nov. 29, 2022

(54) MEMORY CONTROLLER, AND MEMORY SYSTEM INCLUDING THE SAME AND METHOD THEREOF

(71) Applicant: SAMSUNG ELECTRONICS CO., LTD., Suwon-si (KR)

(72) Inventors: Kihwan Seong, Hwaseong-si (KR); Soomin Lee, Hwaseong-si (KR); Sanghune Park, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 27 days.

(21) Appl. No.: 17/245,064

(22) Filed: Apr. 30, 2021

(65) Prior Publication Data
US 2021/0249064 A1    Aug. 12, 2021

Related U.S. Application Data

(63) Continuation of application No. 16/678,692, filed on Nov. 8, 2019, now Pat. No. 10,998,036.

(30) Foreign Application Priority Data

May 13, 2019   (KR) .................. 10-2019-0055847

(51) Int. Cl.
  *G11C 29/00*      (2006.01)
  *G11C 11/4076*    (2006.01)
  (Continued)

(52) U.S. Cl.
  CPC ...... *G11C 11/4076* (2013.01); *G06F 11/1068* (2013.01); *G11C 11/4085* (2013.01);
  (Continued)

(58) Field of Classification Search
  CPC ............ G11C 11/4076; G11C 11/4085; G11C 11/4087; G11C 11/4091; G11C 11/4094; G06F 11/1068; H01L 25/0657
  See application file for complete search history.

(56) References Cited

U.S. PATENT DOCUMENTS

7,317,777 B2    1/2008  Cranford, Jr. et al.
7,418,069 B2    8/2008  Schmatz et al.
                (Continued)

FOREIGN PATENT DOCUMENTS

EP       1385306 A1      1/2004

OTHER PUBLICATIONS

Communication dated Jul. 27, 2020, from the European Patent Office in counterpart European Application No. 20150959.3.
(Continued)

*Primary Examiner* — Christine T. Tu
(74) *Attorney, Agent, or Firm* — Sughrue Mion, PLLC

(57) ABSTRACT

A memory controller includes a clock signal generator generating a clock signal; a first data receiving circuit receiving a serial signal having a plurality of logic values from a memory, using the serial signal to compensate for a phase error of the clock signal, and generating a phase-compensated clock signal as a first clock signal; and at least one second data receiving circuit receiving data from the memory, receiving the first clock signal from the first data receiving circuit, and using the first clock signal to recover the data.

20 Claims, 18 Drawing Sheets

(51) Int. Cl.
    *G06F 11/10*       (2006.01)
    *G11C 11/408*    (2006.01)
    *G11C 11/4091*   (2006.01)
    *G11C 11/4094*   (2006.01)
    *H01L 25/065*    (2006.01)

(52) U.S. Cl.
    CPC ....... *G11C 11/4087* (2013.01); *G11C 11/4091* (2013.01); *G11C 11/4094* (2013.01); *H01L 25/0657* (2013.01)

(56) References Cited

U.S. PATENT DOCUMENTS

| | | | |
|---|---|---|---|
| 7,751,519 | B2 | 7/2010 | Farbarik et al. |
| 7,822,113 | B2 | 10/2010 | Tonietto et al. |
| 8,355,431 | B2 | 1/2013 | Lee |
| 9,794,089 | B2 | 10/2017 | Musah et al. |
| 2002/0141280 | A1 | 10/2002 | Hamamoto et al. |
| 2004/0158420 | A1 | 8/2004 | Kim et al. |
| 2007/0183553 | A1* | 8/2007 | Sanders .................. H04L 7/033 375/376 |
| 2010/0002822 | A1 | 1/2010 | Arima et al. |
| 2010/0281289 | A1 | 11/2010 | Chang et al. |
| 2015/0188694 | A1 | 7/2015 | Kuan et al. |
| 2016/0308539 | A1* | 10/2016 | Chen .......................... H03L 7/22 |
| 2016/0336942 | A1 | 11/2016 | Bae et al. |
| 2018/0005686 | A1 | 1/2018 | Oh et al. |
| 2018/0152284 | A1 | 5/2018 | Hossain et al. |
| 2020/0252072 | A1* | 8/2020 | Wu ........................... H03L 7/07 |

OTHER PUBLICATIONS

Notice of Allowance issued in parent U.S. Appl. No. 16/678,692 dated Jan. 6, 2021.

\* cited by examiner

MEMORY CONTROLLER, AND MEMORY SYSTEM INCLUDING THE SAME AND METHOD THEREOF

CROSS-REFERENCE TO RELATED APPLICATION

This is a continuation of U.S. application Ser. No. 16/678,692 filed on Nov. 8, 2019, which claims benefit of priority to Korean Patent Application No. 10-2019-0055847 filed on May 13, 2019, in the Korean Intellectual Property Office, the disclosures of which are herein incorporated by reference in their entirety.

BACKGROUND

The disclosure relates to a memory controller, and a memory system including the same.

A memory controller may initially synchronize data received from a memory device and a clock signal within the memory controller. The memory controller may utilize the data received from the memory device and the clock signal within the memory controller, to recover the data and a clock synchronized with the data.

Over time, a phase difference may occur between the data received from the memory device and the clock signal in the memory controller, due to changes in the external and internal voltage and temperature of the memory controller, and changes in the voltage and temperature of the memory device. In a memory system capable of performing bidirectional data communications, the phase difference may not be sensed during a transmission operation in which the memory controller transmits data to the memory device.

Accordingly, various methods have been proposed to compensate for the phase difference between the received data and the internal clock signal, which may be generated due to the changes in the external and internal voltage and temperature of the memory controller.

SUMMARY

An aspect of the disclosure is to provide a memory system capable of using an error detection code (EDC) to compensate for a phase difference between data input from a memory device and a clock signal in a memory controller.

According to an aspect of the disclosure, a memory controller includes a clock signal generator configured to generate a clock signal; a first data receiving circuit configured to receive a serial signal from a memory, the serial signal comprising a plurality of logic values, compensate for a phase error of the clock signal based on the serial signal, and generate a phase-compensated clock signal as a first clock signal; and at least one second data receiving circuit configured to receive data from the memory, receive the first clock signal from the first data receiving circuit, recover the data based on the first clock signal.

According to an aspect of the disclosure, a memory controller includes an error detection code (EDC) bit circuit configured to receive an error detection code (EDC), and recover the EDC and a clock synchronized with the EDC based on a first internal clock signal; and at least one data bit circuit configured to receive data, and recover the data and a clock synchronized with the data based on a second internal clock signal, wherein the EDC bit circuit is configured to receive a clock signal from a clock signal generator, and adjust a phase of the clock signal to generate the first internal clock signal and the second internal clock signal.

According to an aspect of the disclosure, a memory system includes a memory device; and a memory controller in communication with the memory device, wherein the memory controller comprises a clock signal generator and a memory interface, wherein the memory interface comprises: a first data receiving circuit configured to receive first data from the memory device, receive an internal clock signal from the clock signal generator, control a phase of the internal clock signal to synchronize the first data and the internal clock signal, output a phase-controlled clock signal as a first internal clock signal, and recover the first data based on the first internal clock signal; and a second data receiving circuit configured to receive second data from the memory device, receive the first internal clock signal from the first data receiving circuit, and recover the second data based on the first internal clock signal, wherein the first data is a serial signal having a plurality of logic values.

According to an aspect of the disclosure, a method of operating a memory controller in communication with a memory device includes receiving a serial signal having a plurality of logic values from the memory device, by a first data receiving circuit; receiving an internal clock signal from a clock signal generator included in the memory controller, by the first data receiving circuit; controlling a phase of the internal clock signal to output the phase-controlled internal clock signal as a first internal clock signal, to synchronize the serial signal and the internal clock signal, by the first data receiving circuit; receiving data from the memory device and receiving the first internal clock signal from the first data receiving circuit, by a second data receiving circuit; and recovering the received data from the memory device based on the first internal clock signal, by the second data receiving circuit.

BRIEF DESCRIPTION OF DRAWINGS

The above and other aspects, features, and advantages of the disclosure will be more clearly understood from the following detailed description, taken in conjunction with the accompanying drawings, in which.

DETAILED DESCRIPTION

Hereinafter, embodiments of the disclosure will be described with reference to the accompanying drawings.

Figure 1:
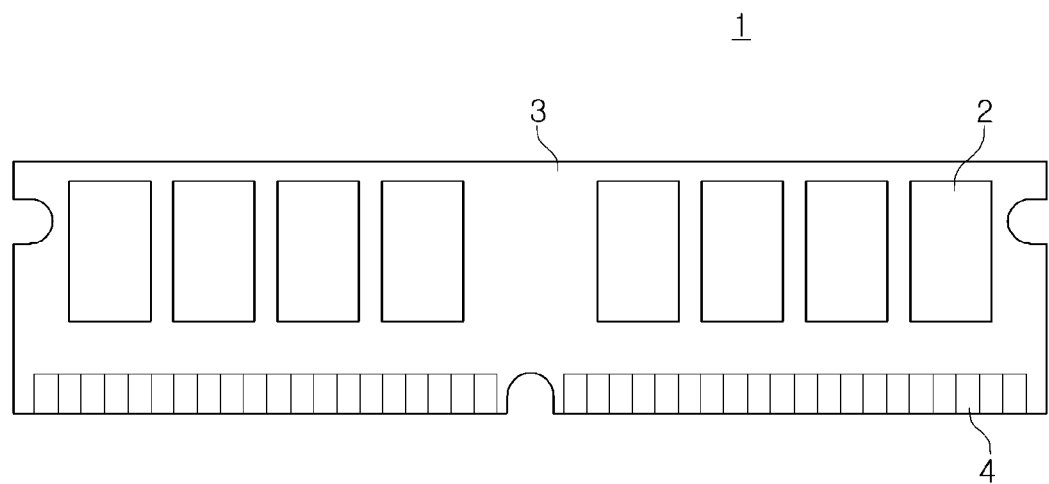
FIGS. 1 and 2 are views illustrating a memory package according to an embodiment of the disclosure.
Figure 2:
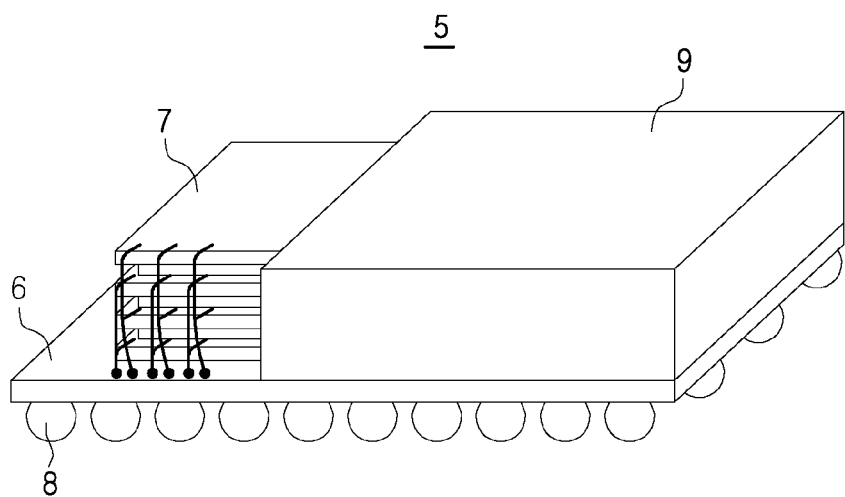

FIGS. 1 and 2 are views illustrating a memory package according to an embodiment of the disclosure.

First, referring to FIG. 1, a memory package 1 according to an embodiment of the disclosure may include a plurality of memory devices 2, a package substrate 3 on which the plurality of memory devices 2 may be mounted, and the like. Input/output pins 4 for transmitting/receiving data may be provided at one end of the package substrate 3. The plurality of memory devices 2 may receive and store data through the input/output pins 4, or may output data through the input/output pins 4. In FIG. 1, a single memory package 1 is illustrated as including eight memory devices 2, but the number of memory devices 2 may vary depending on data storage capacity that the memory package 1 is intended to provide, data storage capacity of each of the memory devices 2, and the like. The package substrate 3 may be provided with an input/output bus for connecting the memory devices 2 and the input/output pins 4, and at least a portion of the memory devices 2 may share the input/output bus.

Referring to FIG. 2, a memory package 5 according to an embodiment of the disclosure may include a package substrate 6, a plurality of memory devices 7 vertically stacked on an upper surface of the package substrate 6, solder bumps 8 provided on a lower surface (opposite the upper surface) of the package substrate 6, an encapsulant 9, and the like. In an embodiment illustrated in FIG. 2, the memory devices 7 may be stacked on the package substrate 6 in a vertical direction. The memory devices may include one stack of memory devices, as illustrated in FIG. 2, or multiple stacks of memory devices disposed on the upper surface of the package substrate 6 extending in the vertical direction. The memory devices 7 may be connected to the solder bumps 8 via wires or through silicon vias (TSV), and at least a portion of the memory devices 7 may share the solder bumps 8.

Figure 3:
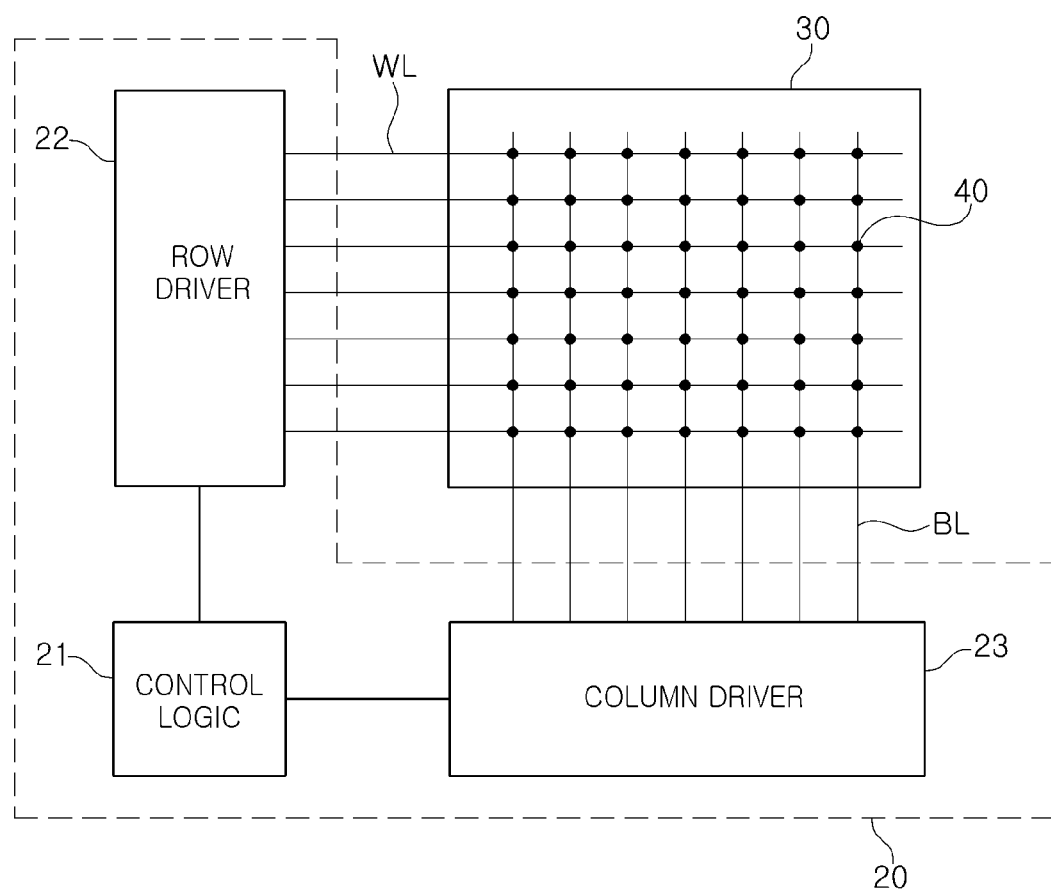
FIG. 3 is a block diagram illustrating a memory device according to an embodiment of the disclosure.

FIG. 3 is a simplified diagram illustrating a memory device according to an embodiment of the disclosure.

A memory device 10 according to an embodiment illustrated in FIG. 3 may be employed as the plurality of memory devices 2, 7 included in the memory package 1, 5 illustrated in FIGS. 1 and 2. Referring to FIG. 3, a memory device 10 according to an embodiment of the disclosure may include a memory controller 20 and a bank array 30. In an embodiment, the memory controller 20 may include a control logic 21, a row driver 22, a column driver 23, and the like. The bank array 30 may include a plurality of memory cells 40, which may respectively correspond to intersections of rows corresponding to word lines WL and columns corresponding to column bit lines BL in the bank array 30.

In an embodiment, the row driver 22 may be connected to the memory cells 40 via word lines WL, and the column driver 23 may be connected to the memory cells 40 via bit lines BL. In an embodiment, the row driver 22 may include an address decoder for selecting a memory cell MC in which to write data or from which to read data, and the column driver 23 may include a sense amplifier and a column decoder for reading data from or writing data in the memory cell MC. Operations of the row driver 22 and the column driver 23 may be controlled by the control logic 21.

Figure 4:
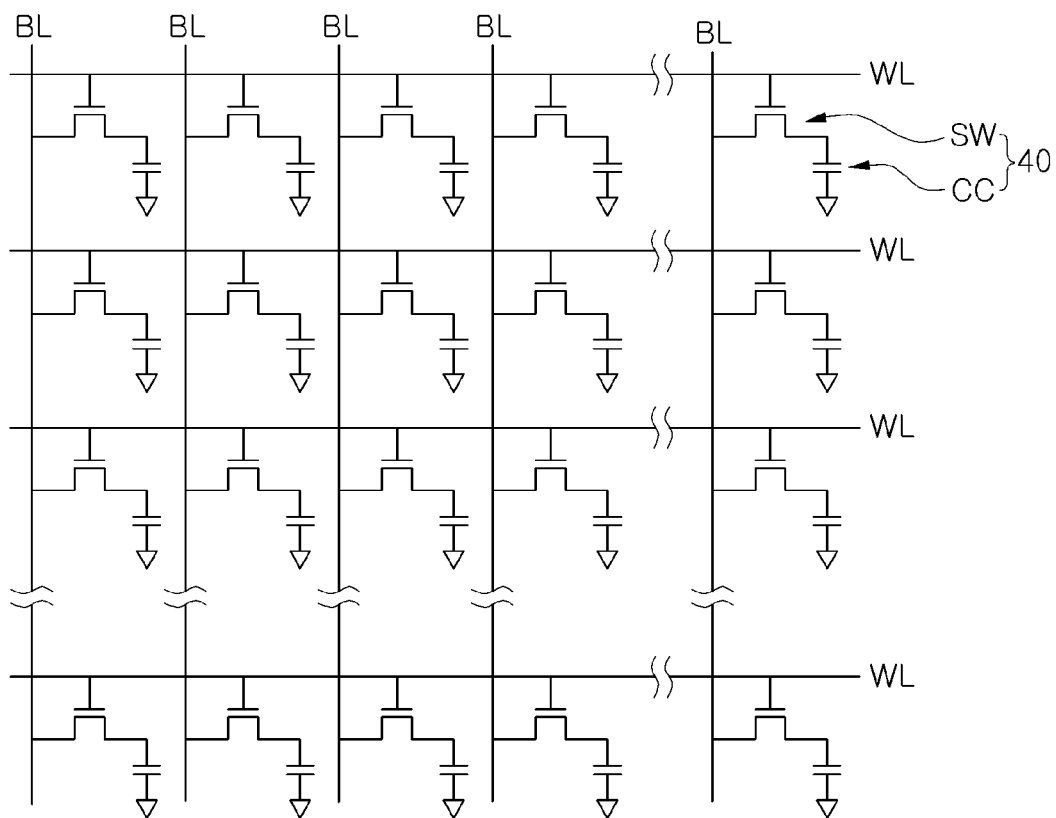
FIG. 4 is a view illustrating a bank array included in a memory device according to an embodiment of the disclosure.

FIG. 4 is a view illustrating a bank array included in a memory device according to an embodiment of the disclosure.

Referring to FIG. 4, a bank array 30 according to an embodiment of the disclosure may include a plurality of memory cells 40. The memory cells 40 may be provided at points in which a plurality of word lines WL and a plurality of bit lines BL intersect each other. For example, each of the memory cells 40 may be connected to one word line WL and one bit line BL.

Each of the memory cells 40 may include a switch element SW and an information storage capacitor CC. In an embodiment, the switch element SW may include a transistor, a gate terminal of the transistor may be connected to the word line WL, and drain/source terminals of the transistor may be connected to the bit line BL and the information storage capacitor CC, respectively.

A memory controller 20 may charge electric charges to the information storage capacitor CC included in each of the plurality of memory cells 40, via the plurality of word lines WL and the plurality of bit lines BL, or may discharge the electric charges charged in the information storage capacitor CC to write or erase data therein or therefrom. Further, the memory controller 20 may read data from each of the plurality of memory cells 40 by reading a voltage of the information storage capacitor CC and the like. In an embodiment, the memory controller 20 may perform a refresh operation of rewriting data to the plurality of memory cells 40, such that the electric charges charged in the information storage capacitor CC are naturally discharged not to lose data.

Figure 5:
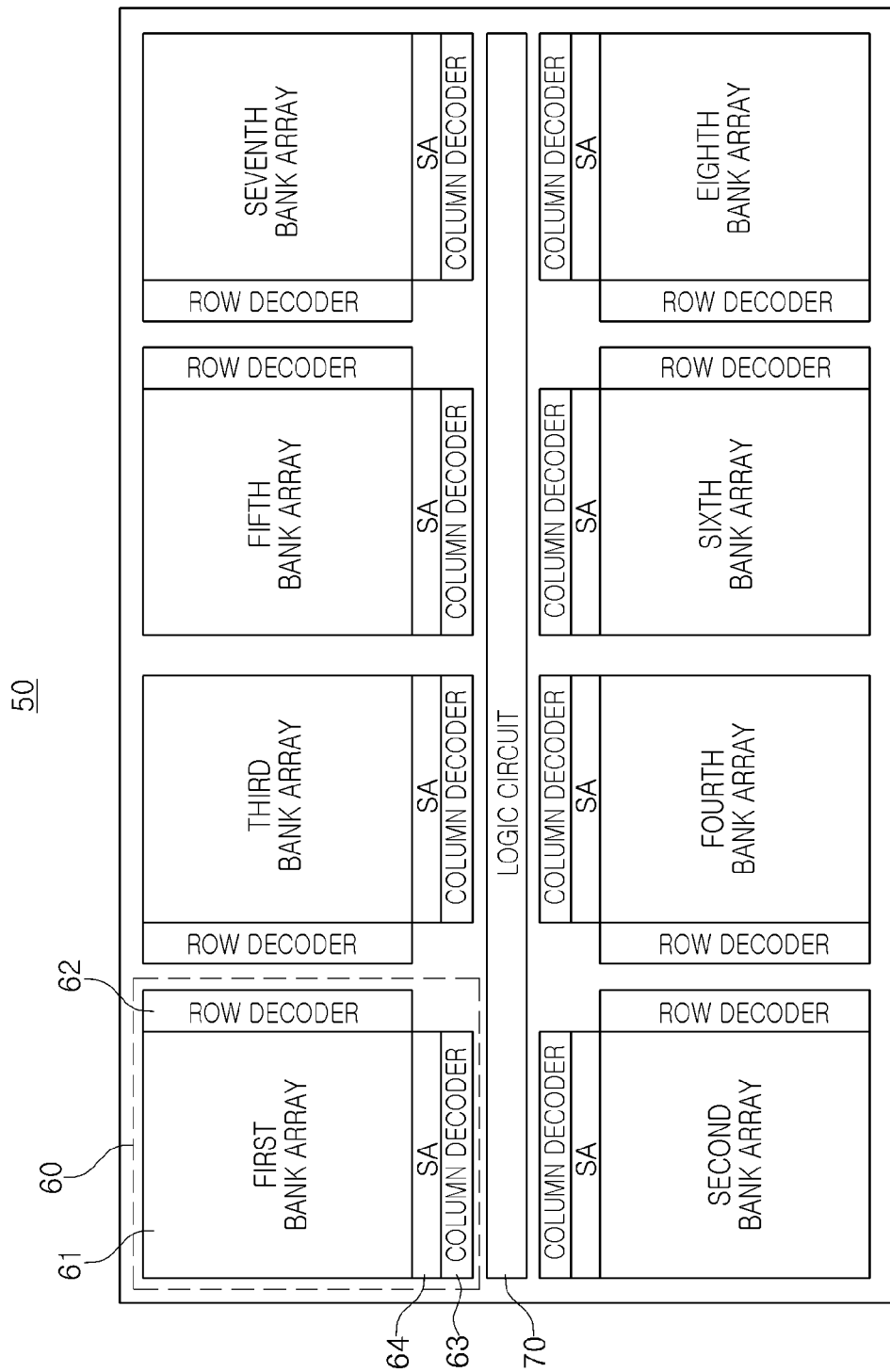
FIG. 5 is a view illustrating a structure of a memory device according to an embodiment of the disclosure.

FIG. 5 is a view illustrating a structure of a memory device according to an embodiment of the disclosure.

Referring to FIG. 5, a memory device 50 in accordance with an embodiment of the disclosure may include a memory bank 60 and a logic circuit 70. In an embodiment, the memory bank 60 may include a bank array 61 having a plurality of memory cells, a row decoder 62, a column decoder 63, and a sense amplifier 64 (SA). In an embodiment, the memory device 50 may include a plurality of memory banks 60. For example, FIG. 5 illustrates first to eighth memory banks 60, but the number of memory banks 60 is not limited to the specific configuration of FIG. 5.

The plurality of memory banks 60 included in the memory device 50 may share access to a single logic circuit 70. The logic circuit 70 may selectively read data from the bank array 61, store data in the bank array 61, or delete data stored in the bank array 61. The logic circuit 70 may include a control logic or the like for controlling the row decoder 62, the column decoder 63, the sense amplifier 64, and the like, together with a receiver and a transmitter connected to input/output pins for receiving and transmitting data. Thereby, the logic circuit 70 may selectively control each bank array 61.

Figure 6:
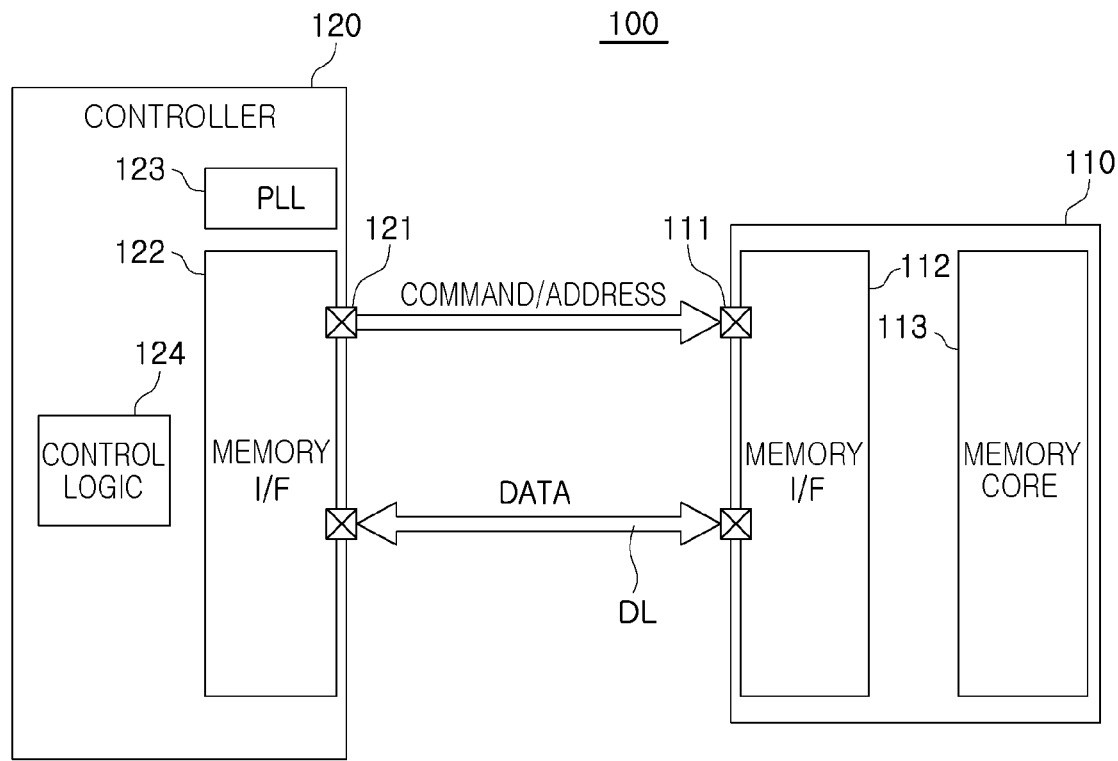
FIG. 6 is a view illustrating a structure of a memory system according to an embodiment of the disclosure.

FIG. 6 is a view illustrating a structure of a memory system according to an embodiment of the disclosure.

Referring to FIG. 6, a memory system 100 may include a memory device 110 and a memory controller 120. The memory device 110 may be, but is not limited to, GDDR6 (Graphics Double Data Rate Version 6). A data bus for receiving and transmitting data (DATA) in units of bytes, and data lanes (DL) such as an address/command bus for receiving and transmitting address/command (Command/Address) may be connected between the memory device 110 and the memory controller 120. The data (DATA) may include data (DQ) and an error detection code (EDC). For example, 1-byte data (DATA) may include 8-bit data (DQ) and 1-bit EDC.

The memory device 110 may include a plurality of input/output pins 111, a memory interface 112 (I/F), and a memory core 113. The memory interface 112 may be coupled to the data lanes (DL) via the plurality of input/output pins 111.

The memory controller 120 may control the memory device 110 to write data to the memory device 110 and to read the data stored in the memory device 110. The memory controller 120 may include a plurality of input/output pins 121, a memory interface 122, a clock signal generator 123, and a control logic 124. The memory interface 122 may be connected to the data lanes (DL) via the plurality of input/output pins 121. An operation of the memory interface 122 may be controlled by the control logic 124.

A receiving terminal of the memory interface 122 may include a clock and data recovery (CDR) circuit. The CDR circuit may be a circuit for using data received from the memory device 110 and a clock signal in the memory controller 120 to recover the data and a clock synchronized with the data.

A phase difference may occur between the data and the clock signal due to changes in the external and internal voltage and temperature of the memory controller 120, and the like. In an embodiment of the disclosure, the CDR circuit may dynamically sense the phase difference between the data and the clock signal in real time, and may simultaneously compensate all receivers of the memory interface 122 for the sensed phase difference.

Figure 7:
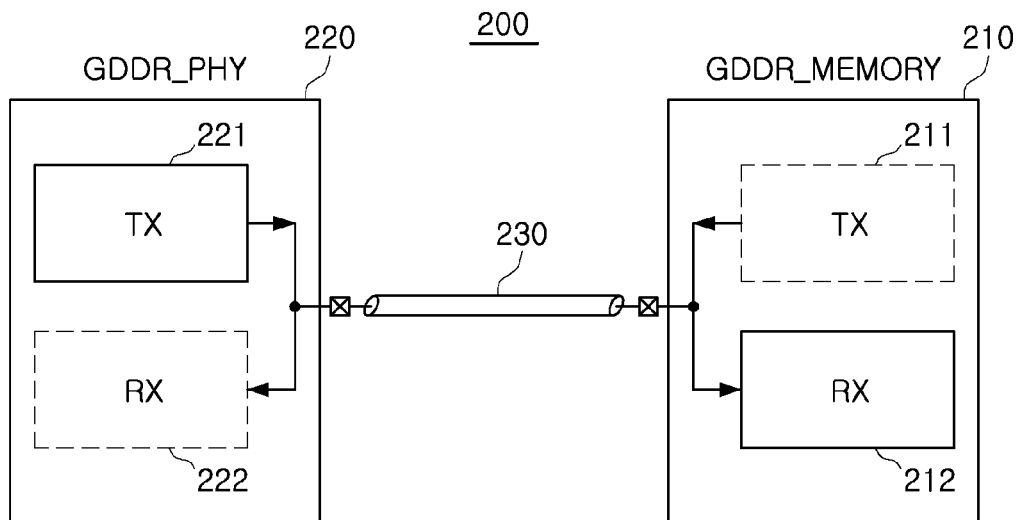
FIG. 7 is a view illustrating a memory system according to an embodiment of the disclosure.

FIG. 7 is a view illustrating a memory system according to an embodiment of the disclosure.

Referring to FIG. 7, a memory system 200 may include a memory device 210, a memory controller 220, and a data lane 230. The memory device 210 may include a first transmitter 211 (TX) and a first receiver 212 (RX), and the memory controller 220 may include a second transmitter 221 (TX) and a second receiver 222 (RX).

In the memory system 200, the second receiver 222 of the memory controller 220 may receive data from the memory device 210, and may receive a clock signal from a clock signal generator in the memory controller 220, in an initial training mode. The second receiver 222 may control a phase of the clock signal such that the clock signal and the data are synchronized with each other.

The memory system 200 may bidirectionally transmit data (DQ) in both directions between the memory device 210 and the memory controller 220 in a normal operation mode. When the memory controller 220 operates in a transmission mode for transmitting data (DQ) to the memory device 210, the second transmitter 221 of the memory controller 220 may be activated and the second receiver 222 of the memory controller 220 may be deactivated. On the other hand, when the memory controller 220 operates in a reception mode for receiving data (DQ) from the memory device 210, the second receiver 222 of the memory controller 220 may be activated and the second transmitter 221 of the memory controller 220 may be deactivated.

As illustrated in FIG. 7, when the memory controller 220 operates in a transmission mode, the second transmitter 221 of the memory controller 220 may be activated and the second receiver 222 of the memory controller 220 may be deactivated. A phase difference may occur between the data (DQ) and the clock signal synchronized in the training mode due to the changes in the external and internal voltage and temperature of the memory controller 220. The second receiver 222 of the memory controller 220 may not detect the phase difference occurring between the data and the clock signal.

Thereafter, when the memory controller 220 operates in the reception mode, the second receiver 222 of the memory controller 220 may be activated and the second transmitter 221 of the memory controller 220 may be deactivated. Because the second receiver 222 of the memory controller 220 may not sense the phase difference occurring between the data and the clock signal, the second receiver 222 may not successfully recover the data and the clock signal.

The memory controller 220 may always receive an error detection code (EDC) from the memory device 210. The EDC may be a code for detecting an error in the data (DQ).

For example, when the memory controller 220 is in the transmission mode, the memory controller 220 may receive an EDC from the memory device 210, the EDC is the result of data (DQ) transmitted to the memory device 210. According to an embodiment, when the memory controller 220 is in the reception mode, the memory controller 220 may receive an EDC from the memory device 210, the EDC is the result of data (DQ) received to memory controller 220. According to an embodiment, the memory controller 220 may receive predetermined pattern data from the memory device 210, even when the memory controller 220 is in an idle state, not transmitting or receiving the data (DQ).

According to an embodiment, the memory controller 220 may always receive an error correction code (ECC) from the memory device 210, instead of the EDC. The ECC may be a code for correcting an error in the data (DQ). A signal that the memory controller 220 always receives from the memory device 210 is not limited to the EDC or the ECC, but may be a serial signal having a plurality of logic values.

Because the memory controller 220 may always receive the EDC from the memory device 210, a phase difference between the data (DQ) received from the memory device 210 and the clock signal in the memory controller 220 may be monitored in real time by using the EDC. In an embodiment of the disclosure, the second receiver 222 of the memory controller 220 may a CDR circuit capable of using the EDC to sense the phase difference between the data (DQ) and the clock signal in real time, and simultaneously compensating all receivers of the second receiver for the sensed phase difference at once. For example, the second receiver 222 of the memory controller 220 may compensate for the phase error of the clock signal, based on at least two bits of the serial signal.

Figure 8:
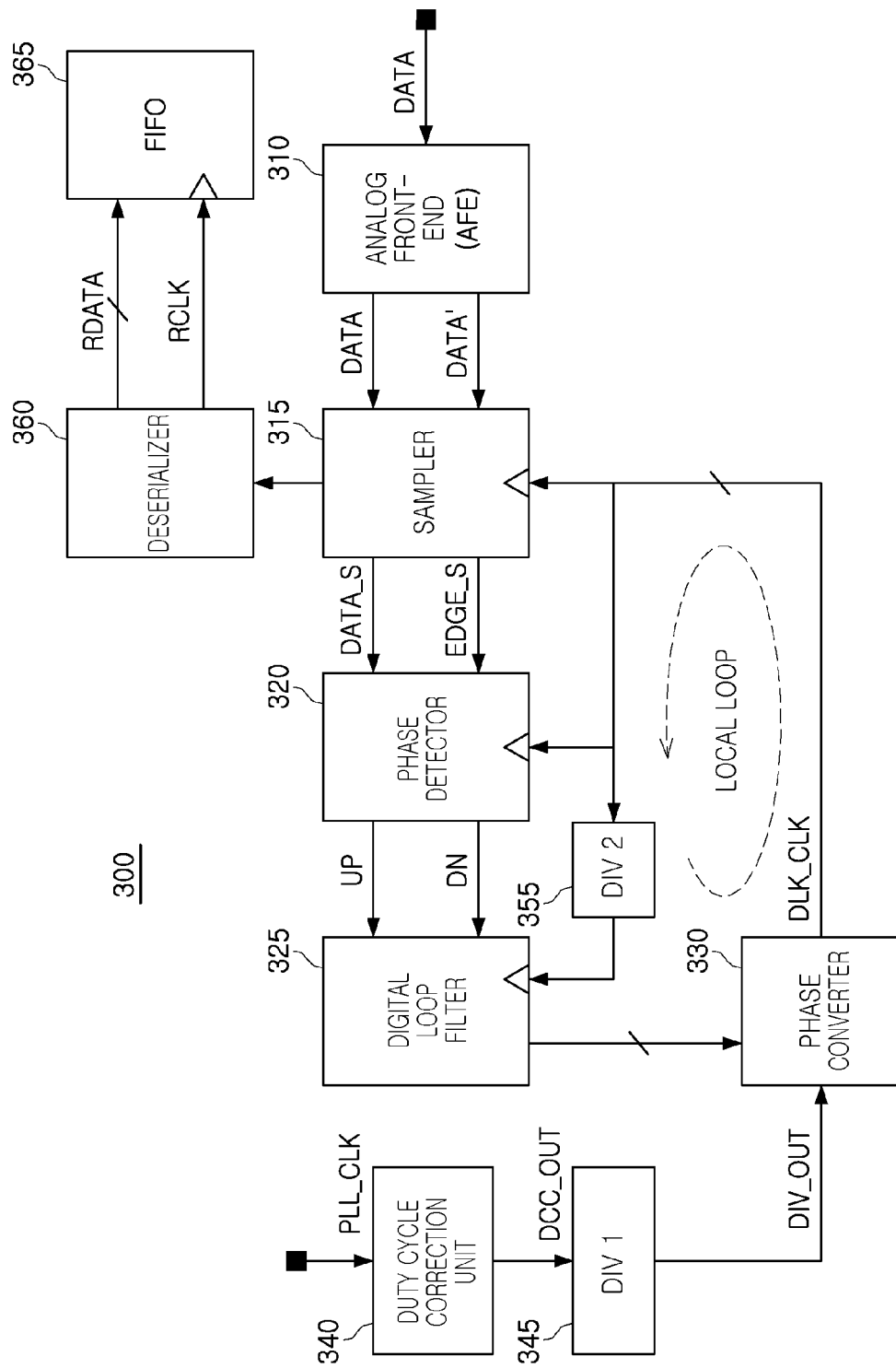
FIG. 8 is a view illustrating an operation of a clock and data recovery (CDR) circuit according to an embodiment of the disclosure.

FIG. 8 is a view illustrating an operation of a CDR circuit according to an embodiment of the disclosure.

Referring to FIG. 8, a clock and data recovery (CDR) circuit 300 may include an analog front-end (AFE) 310, a sampler 315, a phase detector (PD) 320, a digital loop filter (DLF) 325, a phase converter 330, a duty cycle correction unit 340, a first divider 345 (DIV 1), a second divider 355 (DIV 2), a deserializer (DES) 360, and a buffer 365 (FIFO). The components of the CDR circuit 300 may be circuitry configured to execute the functions described herein. The phase converter 330 may include a phase interpolator (PI), a digital controlled delay line (DCDL), or the like, as a circuit for changing a phase of a signal. Further, the phase converter is not limited thereto, and any circuit capable of changing a phase may be utilized.

The AFE 310 may amplify and recover an attenuated analog signal input from the outside, and may convert the attenuated analog signal to a digital signal. The AFE 310 may include a continuous time linear equalizer (CTLE) and a decision feedback equalizer (DFE).

The sampler 315 may utilize data (DATA, DATA') input from the AFE 310 and a clock signal (DLK_CLK) input from the phase converter 330, to sample data (DATA). The sampler 315 may output sampled data (DATA_S, EDGE_S) to the phase detector 320. The phase detector 320 may receive the sampled data (DATA_S, EDGE_S) from the sampler 315, and may generate phase detection signals (UP, DN) for synchronizing phases of the sampled data (DATA_S, EDGE_S) with the clock signal (DLK_CLK).

The digital loop filter 325 may receive the phase detection signals (UP, DN) from the phase detector 320, and may output a delay signal for increasing or decreasing a delay of the clock signal (DLK_CLK) to the phase converter 330, based on the phase detection signals (UP, DN). According to an embodiment, the second divider 355 may divide a frequency of the clock signal (DLK_CLK) to output the frequency-divided clock signal (DLK_CLK) to the digital loop filter 325.

For example, when the digital loop filter 325 receives a first phase detection signal (UP) from the phase detector 320, the digital loop filter 325 may output a delay signal for decreasing a delay of the clock signal (DLK_CLK) to the phase converter 330. According to an embodiment, when the digital loop filter 325 receives a second phase detection signal (DN) from the phase detector 320, the digital loop filter 325 may output a delay signal for increasing a delay of the clock signal (DLK_CLK) to the phase converter 330.

The duty cycle correction unit 340 may receive a clock signal (PLL_CLK) from a clock signal generator, and may correct a duty cycle of the clock signal (PLL_CLK) to output the duty cycle-corrected clock signal (DCC_OUT). The first divider 345 may divide a frequency of the duty cycle-corrected clock signal (DCC_OUT) to output the frequency-divided clock signal (DIV_OUT).

The phase converter 330 may receive the delay signal from the digital loop filter 325, and may receive the frequency-divided clock signal (DIV_OUT) from the first divider 345. The phase converter 330 may utilize the delay signal to change or adjust (hereinafter referred to as change) a phase of the frequency-divided clock signal (DIV_OUT), and may output the phase-changed internal clock (DLK_CLK).

The sampler 315 may utilize the phase-changed internal clock (DLK_CLK) to sample the data (DATA) input from the AFE 310. The deserializer 360 may recover data (RDATA) having a relatively low frequency, and a synchronized clock (RCLK) with the data, from the sampled data. The buffer 365 may store the recovered data (RDATA), based on the recovered clock (RCLK). The buffer 365 may be a first-in first-out (FIFO) buffer.

Figure 9:
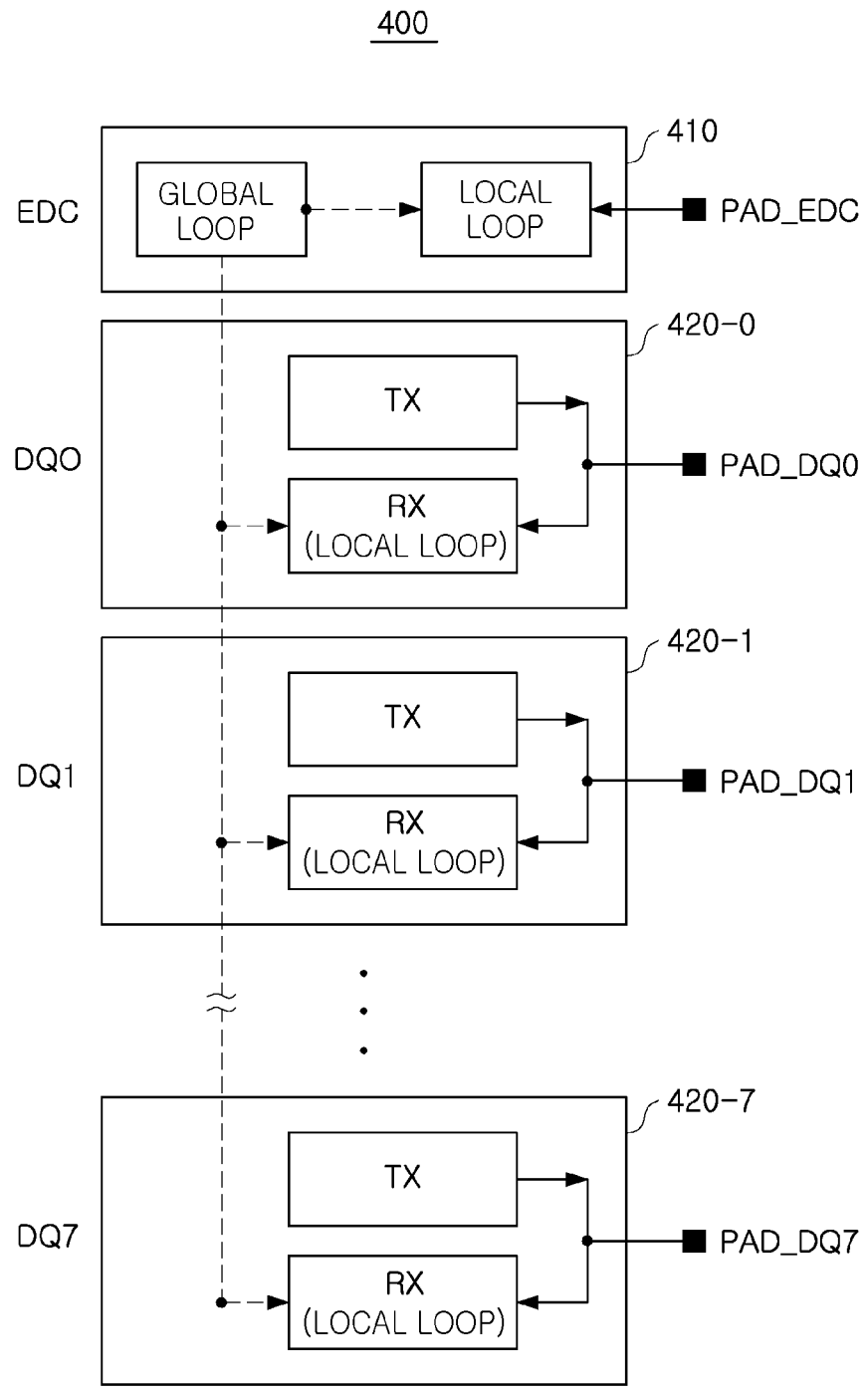
FIG. 9 illustrates a CDR circuit according to an embodiment of the disclosure.

FIG. 9 illustrates a CDR circuit according to an embodiment of the disclosure. Referring to FIG. 9, a CDR circuit 400 according to an embodiment of the disclosure may include one EDC bit circuit 410 and eight DQ bit circuits 420-0 to 420-7. The CDR circuit 400 illustrated in FIG. 9 is merely an embodiment of the disclosure, and the number of EDC bit circuits and DQ bit circuits included in the CDR circuit 400 of the disclosure may vary.

The EDC bit circuit 410 may receive the EDC from a memory device via an EDC pad (PAD_EDC). The EDC bit circuit 410 may utilize a first internal clock to recover an EDC and a clock synchronized with the EDC.

Each of the DQ bit circuits 420-0 to 420-7 may receive data (DQ) from a memory device via DQ pads (PAD_DQ0 to PAD_DQ7). Each of the DQ bit circuits 420-0 to 420-7 may utilize a second internal clock or a third internal clock to recover a DQ and a clock synchronized with the DQ.

The EDC bit circuit 410 may operate in a global loop mode and a local loop mode. When the EDC bit circuit 410 operates in the global loop mode, the EDC bit circuit 410 may receive a clock signal from a clock signal generator, and may change a phase of the clock signal through a global loop. The EDC bit circuit 410 may output the phase-changed clock signal as the first internal clock and the second internal clock.

When the EDC bit circuit 410 operates in the local loop mode, the EDC bit circuit 410 may receive a clock signal from the clock signal generator, and may change a phase of the clock signal through a local loop. The EDC bit circuit 410 may output the phase-changed or phase-corrected clock signal as the first internal clock, and may output the clock signal of the clock signal generator as the second internal clock.

When the EDC bit circuit 410 operates in a mode in which both the global loop and the local loop operate, the EDC bit circuit 410 may receive the clock signal from the clock signal generator, and may utilize the received clock signal to change a phase of the clock signal through the global loop. The EDC bit circuit 410 may utilize the phase-changed clock signal to convert a phase of the phase-changed clock signal through the local loop. The EDC bit circuit 410 may output the phase-changed clock signal through the local loop as the first internal clock, and may output the phase-changed clock signal through the global loop as the second internal clock.

According to an embodiment, when the EDC bit circuit 410 operates in the normal mode, the EDC bit circuit 410 may receive a clock signal from the clock signal generator, and may output the clock signal as the first internal clock and the second internal clock.

As described above, the EDC bit circuit 410 may be configured to perform in a global loop mode, a local loop mode, a mode in which the global loop and the local loop operate together, and a normal mode. According to an embodiment, when the global loop mode is replaced with the local loop mode, only the global loop mode may be operated.

The EDC bit circuit 410 may utilize the first internal clock to recover an EDC received from the memory device and a clock synchronized with the EDC.

Each of the DQ bit circuits 420-0 to 420-7 may receive the second internal clock from the EDC bit circuit 410. Each of the DQ bit circuits 420-0 to 420-7 may utilize the second internal clock to recover a DQ received from the memory device and a clock synchronized with the DQ.

Each of the DQ bit circuits 420-0 to 420-7 may operate in a local loop mode. When each of the DQ bit circuits 420-0 to 420-7 operates in the local loop mode, each of the DQ bit circuits 420-0 to 420-7 may receive the second internal clock from the EDC bit circuit 410. Each of the DQ bit circuits 420-0 to 420-7 may change a phase of the second internal clock through the local loop. Each of the DQ bit circuits 420-0 to 420-7 may output the phase-changed second internal clock as a third internal clock. Each of the DQ bit circuits 420-0 to 420-7 may utilize the third internal clock to recover data received from the memory device and a clock synchronized with the data.

According to an embodiment, when each of the DQ bit circuits 420-0 to 420-7 operates in the normal mode, each of the DQ bit circuits 420-0 to 420-7 may receive the second internal clock from the EDC bit circuit 410, and may utilize the second internal clock to recover data received from the memory device and a clock synchronized with the data.

As described above, in the initial training mode, the memory system may synchronize the data received from the memory device and the clock signal in the memory controller. When the memory system operates in the normal operation mode and the memory controller operates in the transmission mode, the receiver included in each of the DQ bit circuits 420-0 to 420-7 may be deactivated.

While the memory controller operates in the transmission mode, a phase difference may occur between the data and clock signals synchronized in the training mode due to changes in the external and internal voltage and temperature of the memory controller. The receiver included in each of the DQ bit circuits 420-0 to 420-7 may not sense the phase difference between the data and the clock signal, because the receiver is in an inactive state.

The EDC bit circuit 410 may always receive the EDC and may thus always be activated. The EDC bit circuit 410 may sense the phase difference between the EDC and the clock signal, while the memory controller operates in the transmission mode. The EDC bit circuit 410 may control the phase of the clock signal to compensate for the phase difference between the EDC and the clock signal. The EDC bit circuit 410 may transmit the phase-controlled clock signal to each of the DQ bit circuits 420-0 to 420-7, while the memory controller operates in the transmission mode.

The DQ bit circuits 420-0 to 420-7 may utilize the phase-controlled clock signal to recover the data received from the memory device and the clock synchronized with the data, while the memory controller operates in the reception mode. Therefore, the CDR circuit 400 may simultaneously compensate all DQ bit circuits 420-0 to 420-7 for the phase difference between the data received from the memory device and the internal clock signal at once.

Figure 10:
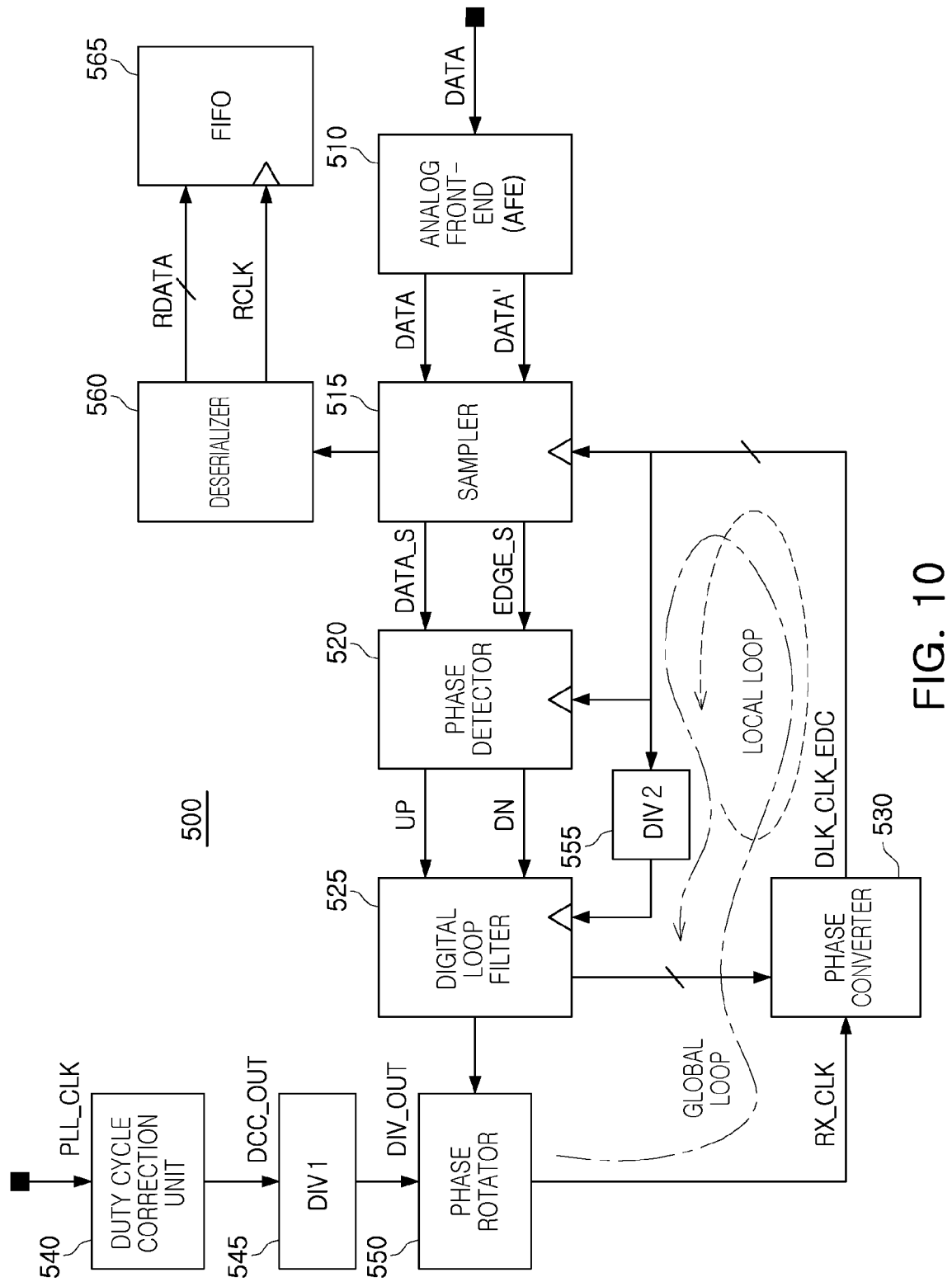
FIG. 10 is a view illustrating an operation of an EDC bit circuit according to an embodiment of the disclosure.
Figure 11:
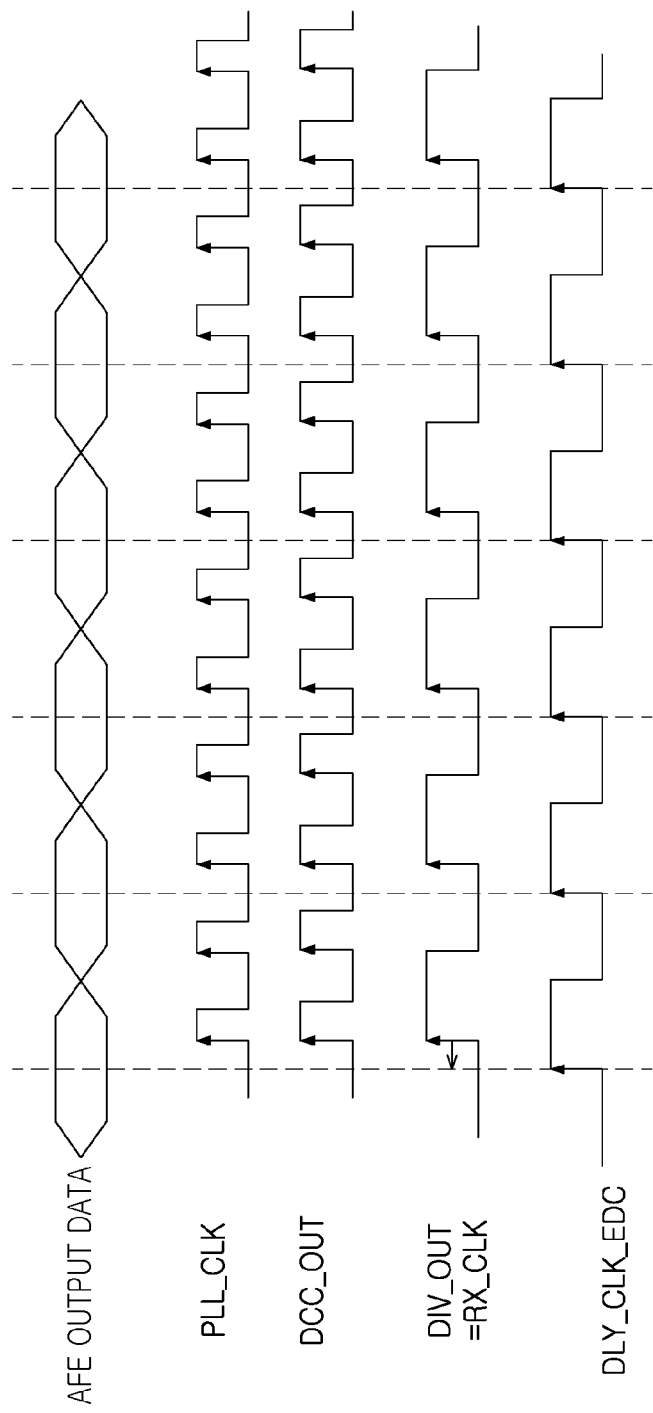
FIGS. 11 and 12 are timing diagrams illustrating an operation of an EDC bit circuit.
Figure 12:
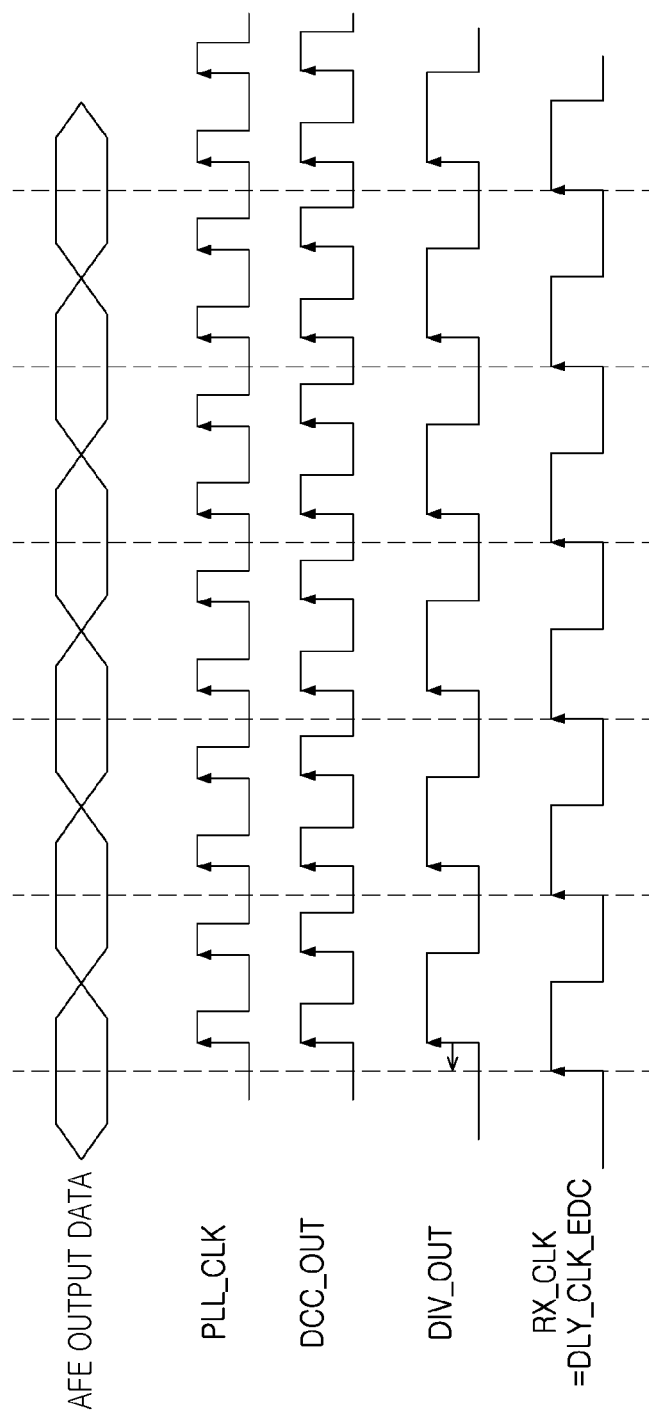

FIG. 10 is a view illustrating an operation of an EDC bit circuit according to an embodiment of the disclosure. FIGS. 11 and 12 are timing diagrams illustrating an operation of an EDC bit circuit.

Referring to FIG. 10, an EDC bit circuit 500 may include an AFE 510, a sampler 515, a phase detector 520, a digital loop filter 525, a phase converter 530, a duty cycle correction unit 540, a first divider 545 (DIV 1), a phase rotator 550, a second divider 555 (DIV 2), a deserializer 560, and a buffer 565, which may be a first-in first-out (FIFO) buffer.

In a manner different from the CDR circuit 300 of FIG. 8, the EDC bit circuit 500 of FIG. 10 may further include the phase rotator 550. The phase rotator 550 may change a phase of a signal in a manner similar to the phase converter 530.

Referring to FIGS. 10 and 11, when the EDC bit circuit 500 operates in a local loop mode, the AFE 510 may amplify and recover an attenuated EDC input from an external source, and may convert the attenuated EDC to a digital signal. The sampler 515 may utilize data (DATA, DATA') input from the AFE 510 and a clock signal (DLK_CLK_EDC) input from the phase converter 530, to sample data (DATA).

The phase detector 520 may receive the sampled data (DATA_S, EDGE_S) from the sampler 515, and may generate phase detection signals (UP, DN) for synchronizing phases of the sampled data (DATA_S, EDGE_S) and the clock signal (DLK_CLK_EDC).

The digital loop filter 525 may receive the phase detection signals (UP, DN) from the phase detector 520, and may output a delay signal for increasing or decreasing a delay of the clock signal (DLK_CLK_EDC), based on the phase detection signals (UP, DN). According to an embodiment, the second divider 555 may divide a frequency of the clock signal (DLK_CLK_EDC) to output the frequency-divided clock signal (DLK_CLK_EDC) to the digital loop filter 525.

The duty cycle correction unit 540 may receive a clock signal (PLL_CLK) from a clock signal generator, and may correct a duty cycle of the clock signal (PLL_CLK) to output the duty cycle-corrected clock signal (DCC_OUT). The first divider 545 may divide a frequency of the duty cycle-corrected clock signal (DCC_OUT) to output the frequency-divided clock signal (DIV_OUT). The phase rotator 550 may receive the divided clock signal (DIV_OUT) from the first divider 545, and may output the frequency-divided clock signal (RX_CLK) to the phase converter 530.

The phase converter 530 may receive the delay signal from the digital loop filter 525, and may receive the frequency-divided clock signal (DIV_OUT=RX_CLK) from the phase rotator 550. The phase converter 530 may utilize the delay signal to change a phase of the frequency-divided clock signal (RX_CLK), and may output the phase-changed internal clock (DLK_CLK_EDC).

The sampler 515 may utilize the internal clock (DLK_CLK_EDC) to sample the data (DATA) input from the AFE 510. The deserializer 560 may recover data and a clock synchronized with the data, from the sampled data. The buffer 565 may store the recovered data, based on the recovered clock.

Referring to FIGS. 10 and 12, when the EDC bit circuit 500 operates in the global loop mode, the AFE 510 may amplify and recover an attenuated EDC input that is received from an external source, and may convert the attenuated EDC into a digital signal. The sampler 515 may utilize data (DATA, DATA') input from the AFE 510 and a clock signal (DLK_CLK_EDC) input from the phase converter 530, to sample data (DATA).

The phase detector 520 may receive the sampled data (DATA_S, EDGE_S) from the sampler 515, and may generate phase detection signals (UP, DN) for synchronizing phases of the sampled data (DATA_S, EDGE_S) and the clock signal (DLK_CLK_EDC).

The digital loop filter 525 may receive the phase detection signals (UP, DN) from the phase detector 520, and may output a delay signal for increasing or decreasing a delay of the clock signal (DLK_CLK_EDC), based on the phase detection signals (UP, DN). According to an embodiment, the second divider 555 may divide a frequency of the clock signal (DLK_CLK_EDC) to output the frequency-divided clock signal (DLK_CLK_EDC) to the digital loop filter 525.

The duty cycle correction unit 540 may receive a clock signal (PLL_CLK) from a clock signal generator, and may correct a duty cycle of the clock signal (PLL_CLK) to output the duty cycle-corrected clock signal (DCC_OUT). The first divider 545 may divide a frequency of the duty cycle-corrected clock signal (DCC_OUT) to output the frequency-divided clock signal (DIV_OUT).

The phase rotator 550 may receive the delay signal from the digital loop filter 525, and may receive the frequency-divided clock signal (DIV_OUT) from the first divider 545. The phase rotator 550 may utilize the delay signal to change a phase of the frequency-divided clock signal (DIV_OUT), and may output the phase-changed internal clock signal (RX_CLK).

The internal clock signal (RX_CLK) of the EDC bit circuit may be utilized as the internal clock of the EDC bit circuit, in addition to as the internal clock of the DQ bit circuit. Therefore, the operation of the EDC bit circuit in the global loop mode may provide the complimentary effects of controlling the internal clock of the EDC bit circuit as well as the internal clock of the DQ bit circuit.

Figure 13:
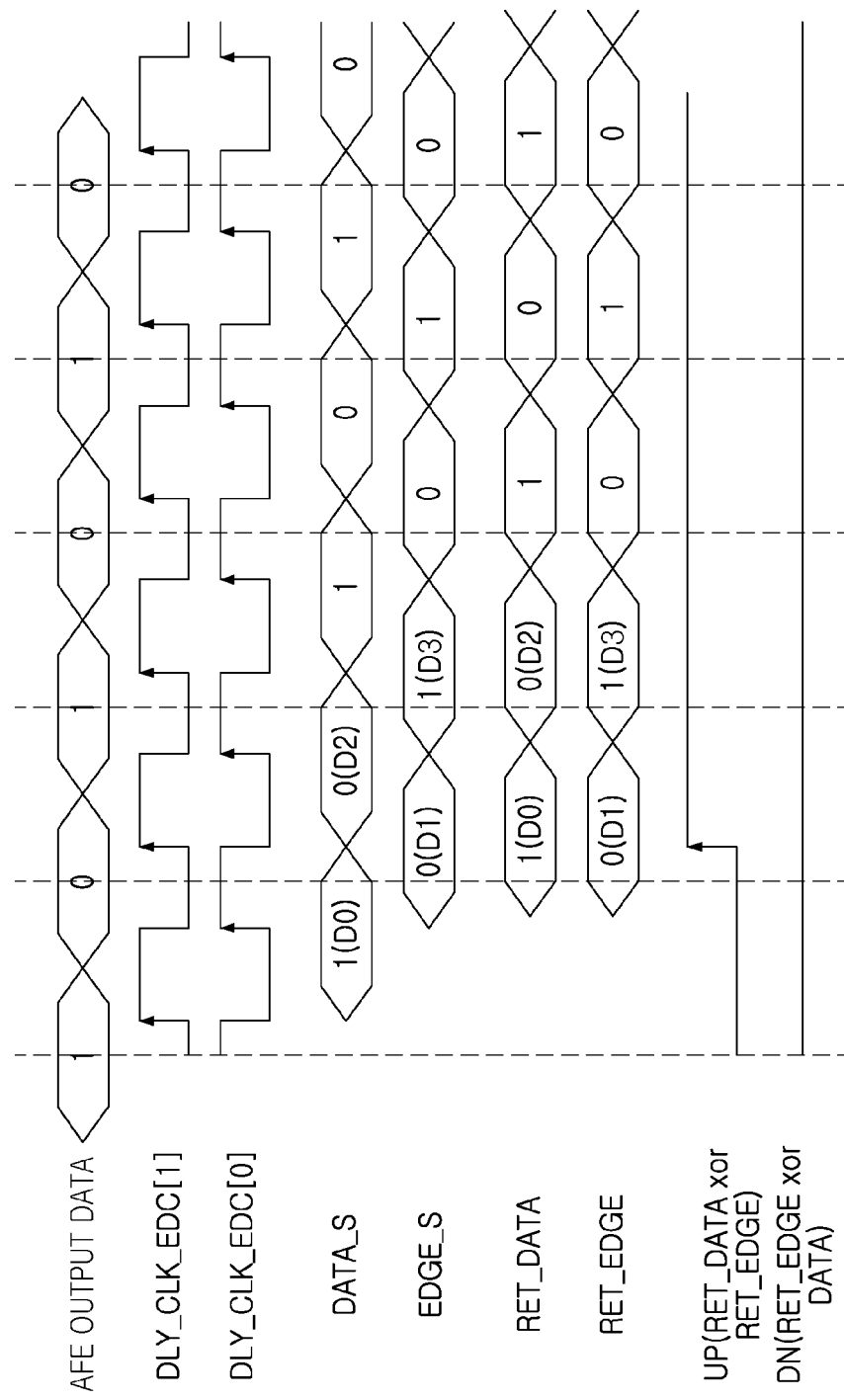
FIGS. 13 and 14 are timing diagrams illustrating an operation of a phase detector.
Figure 14:
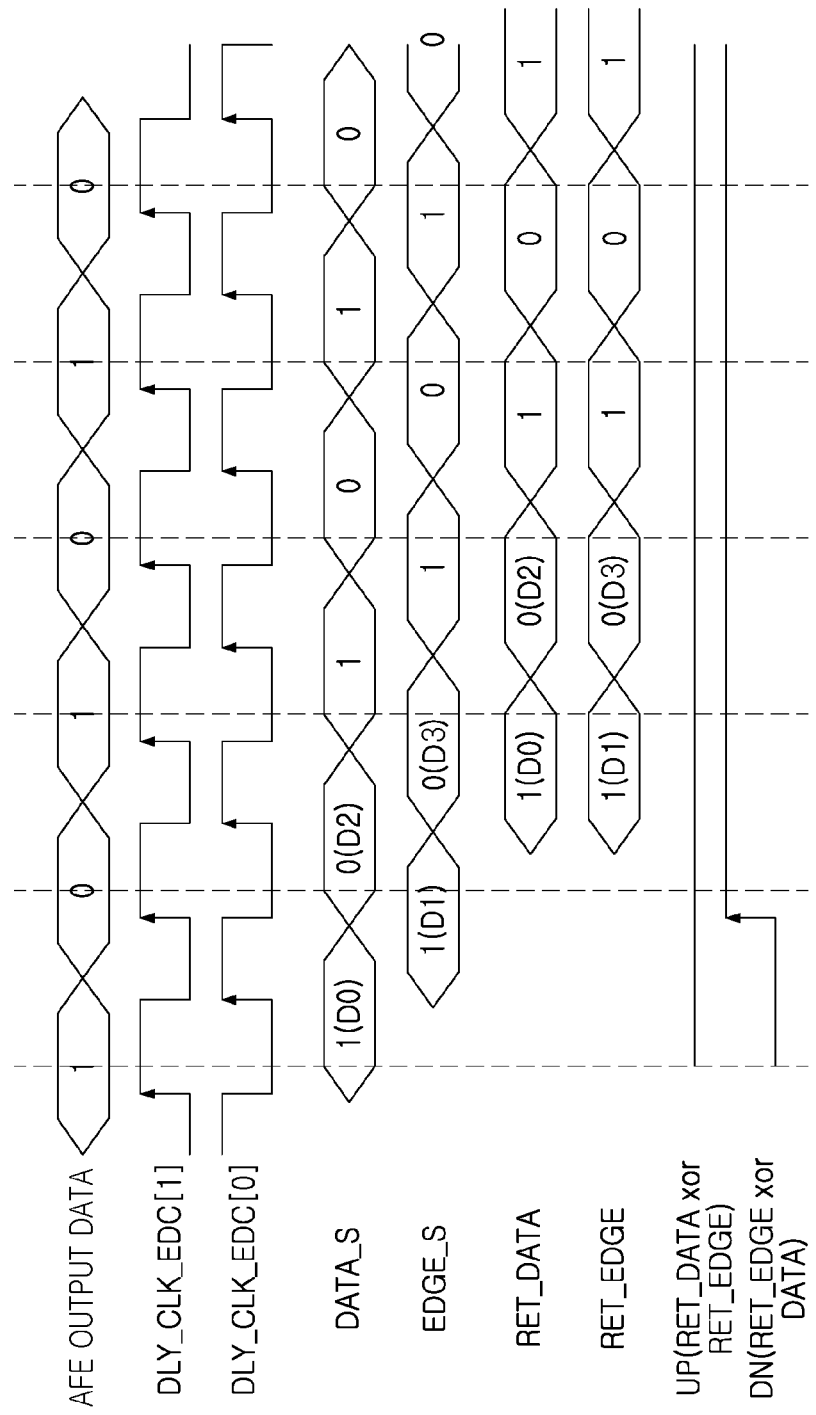

FIGS. 13 and 14 are timing diagrams illustrating an operation of a phase detector. Referring to FIGS. 10 and 13, the phase converter 530 may output a first local clock signal (DLK_CLK_EDC [1]) corresponding to the internal clock signal (DLK_CLK_EDC), and a second local clock signal (DLK_CLK_EDC [0]) in which a phase of the internal clock signal (DLK_CLK_EDC) is adjusted by 180 degrees. The above description is merely an embodiment, and the phase detector may be implemented by using a multi-phase clock.

The sampler 515 may sample output data of the AFE 510 at a rising edge of the first local clock signal (DLK_CLK_EDC [1]) to generate a first sampling data (DATA_S). The sampler 515 may sample output data of the AFE 510 at a rising edge of the second local clock signal (DLK_CLK_EDC [0]) to generate a second sampling data (EDGE_S). The above description is merely an embodiment, and the phase detector may be implemented by using a multi-phase clock.

The phase detector 520 may align the first sampling data (DATA_S) and the second sampling data (EDGE_S). The phase detector 520 may compare a first alignment data (RET_DATA) in which the first sampling data (DATA_S) is aligned, and a second alignment data (RET_EDGE) in which the second sampling data (EDGE_S) is aligned. For example, the phase detector 520 may implement an exclusive OR (XOR) operation taking as input the first alignment data (RET_DATA) and the second alignment data (RET_EDGE) at the rising edge of the first local clock signal (DLK_CLK_EDC [1]).

As a result of the comparison, when the first alignment data (RET_DATA) and the second alignment data (RET_EDGE) do not coincide with each other, the phase detector 520 may output the first phase detection signal (UP), and when the first alignment data (RET_DATA) and the second alignment data (RET_EDGE) coincide with each other, the phase detector 520 may output the second phase detection signal (DN).

The digital loop filter 525 may receive the first phase detection signal (UP) from the phase detector 520, and may generate a delay signal for decreasing a delay of the internal clock signal (DLK_CLK_EDC), based on the first phase detection signal (UP). The phase rotator 550 may receive the delay signal from the digital loop filter 525, and may decrease the delay of the local clock signal (DLK_CLK_EDC) such that the rising edge of the local clock signal (DLK_CLK_EDC) is located in the center of the output data of the AFE 510.

Referring to FIGS. 10 and 14, the phase converter 530 may output a first local clock signal (DLK_CLK_EDC [1]) corresponding to the internal clock signal (DLK_CLK_EDC), and a second local clock signal (DLK_CLK_EDC [0]) in which a phase of the internal clock signal (DLK_CLK_EDC) is adjusted by 180 degrees.

The sampler 515 may sample output data of the AFE 510 at a rising edge of the first local clock signal (DLK_CLK_EDC [1]) to generate a first sampling data (DATA_S). The sampler 515 may sample output data of the AFE 510 at a rising edge of the second local clock signal (DLK_CLK_EDC [0]) to generate a second sampling data (EDGE_S). The above description is merely an embodiment, and the phase detector may be implemented by using a multi-phase clock.

The phase detector 520 may align the first sampling data (DATA_S) and the second sampling data (EDGE_S). The phase detector 520 may compare a first alignment data (RET_DATA) in which the first sampling data (DATA_S) is aligned, and a second alignment data (RET_EDGE) in which the second sampling data (EDGE_S) is aligned. For example, the phase detector 520 may implement an exclusive OR (XOR) operation taking as input the first alignment data (RET_DATA) and the second alignment data (RET_EDGE) at the rising edge of the first local clock signal (DLK_CLK_EDC [1]).

As a result of the comparison, when the first alignment data (RET_DATA) and the second alignment data (RET_EDGE) do not coincide with each other, the phase detector 520 may output the first phase detection signal (UP), and when the first alignment data (RET_DATA) and the second alignment data (RET_EDGE) coincide with each other, the phase detector 520 may output the second phase detection signal (DN).

The digital loop filter 525 may receive the second phase detection signal (DN) from the phase detector 520, and may generate a delay signal for increasing a delay of the internal clock signal (DLK_CLK_EDC), based on the second phase detection signal (DN). The phase rotator 550 may receive the delay signal from the digital loop filter 525, and may increase the delay of the local clock signal (DLK_CLK_EDC) such that the rising edge of the local clock signal (DLK_CLK_EDC) is located in the center of the output data of the AFE 510.

Figure 15A:
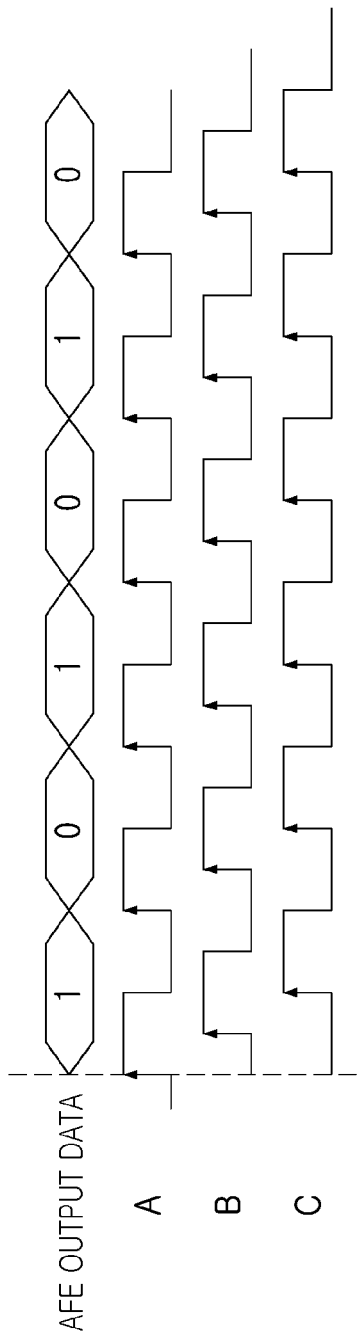
FIGS. 15A and 15B are a view illustrating an operation of a phase rotator according to an embodiment of the disclosure.
Figure 15B:
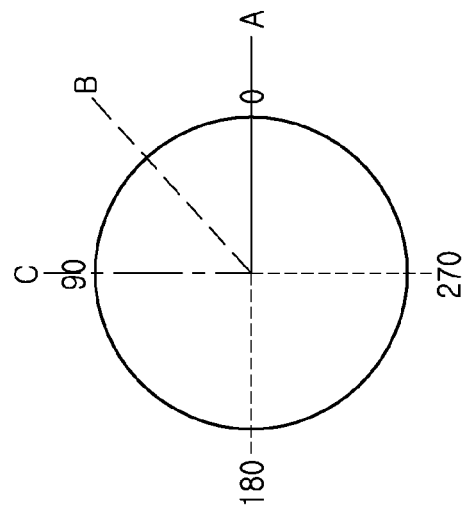

FIGS. 15A and 15B are a view illustrating an operation of a phase rotator according to an embodiment of the disclosure. As described above, the phase rotator 550 may receive the delay signal from the digital loop filter 525, and may receive the clock signal (DCC_OUT) from the first divider 545. The phase rotator 550 may rotate the phase of the clock signal (DCC_OUT) such that the clock signal (DCC_OUT) is located in the center of the output data of the AFE 510.

For example, the rising edge of the clock signal (DCC_OUT) may be located closer to the center of the output data of the AFE 510, as illustrated in FIG. 15A, as the phase of the clock signal (DCC_OUT) increases (A, B, C) as illustrated in FIG. 15B.

Figure 16:
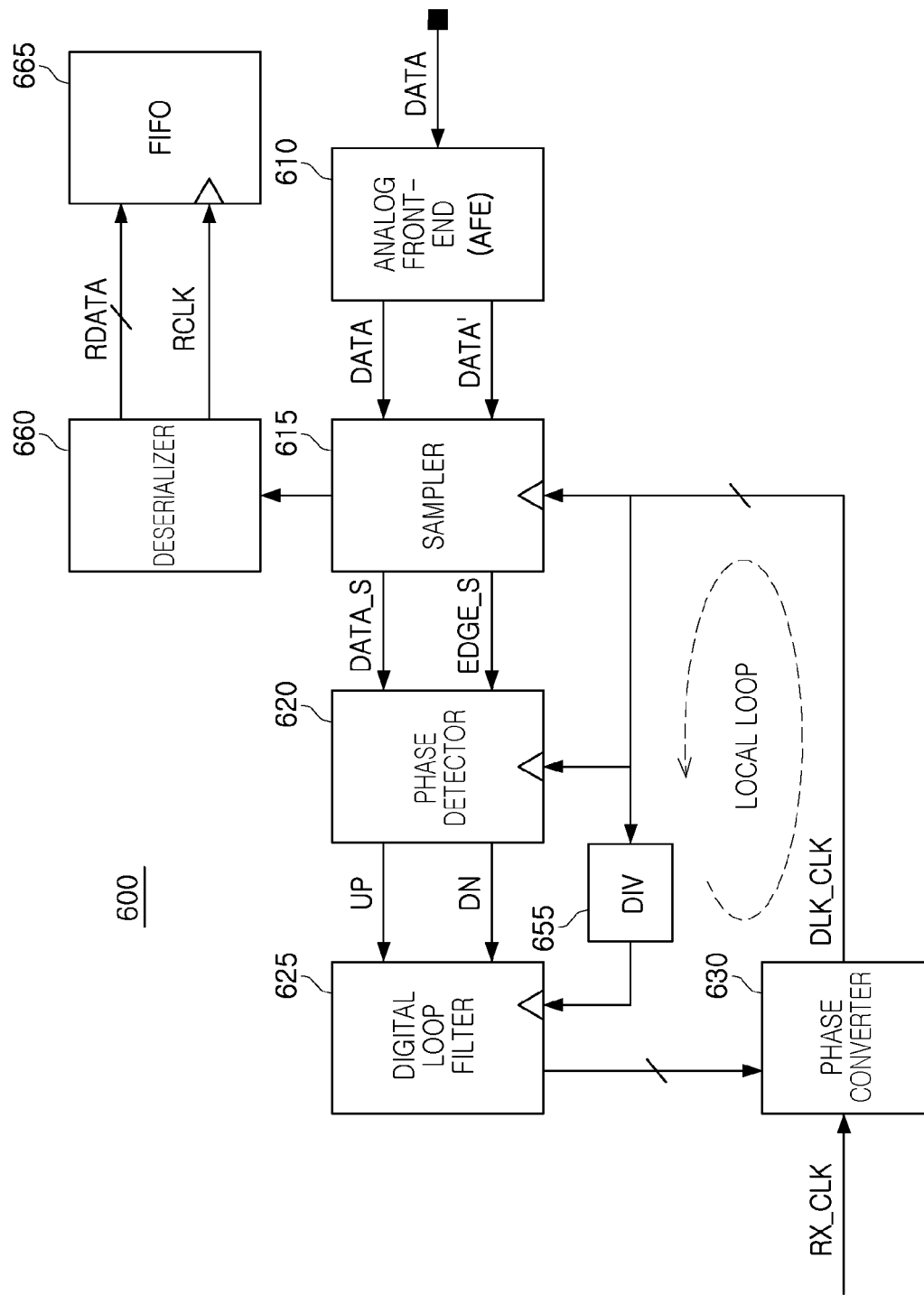
FIG. 16 is a view illustrating an operation of a DQ bit circuit according to an embodiment of the disclosure.

FIG. 16 is a view illustrating an operation of a DQ bit circuit according to an embodiment of the disclosure.

Referring to FIG. 16, a DQ bit circuit 600 may include an AFE 610, a sampler 615, a phase detector 620, a digital loop filter 625, a phase converter 630, a divider 655 (DIV), a deserializer 660, and a buffer 665, which may be a first-in first-out (FIFO) buffer.

When the DQ bit circuit 600 is not in a local loop mode, the AFE 610 may amplify and recover an attenuated DQ input received from an external source, and may convert the attenuated DQ into a digital signal. The phase converter 630 may receive an internal clock signal (RX_CLK) from an EDC bit circuit. The internal clock signal (RX_CLK) received from the EDC bit circuit may be a clock synchronized with an EDC in the EDC bit circuit. The phase converter 630 may output the internal clock signal (RX_CLK) to the sampler 615.

The sampler 615 may utilize the internal clock signal (RX_CLK) to sample the data (DATA) input from the AFE 610. The deserializer 660 may recover data from the sampled data, and a clock synchronized with the data. The buffer 665 may store the recovered data, based on the recovered clock.

According to an embodiment, when the DQ bit circuit 600 operates in the local loop mode, the AFE 610 may amplify and recover the attenuated DQ input from an external source, and may convert the attenuated DQ into a digital signal. The sampler 615 may utilize data (DATA, DATA') input from the AFE 610 and the clock signal (DLK_CLK) received from the phase converter 630, to sample data (DATA).

The phase detector 620 may receive the sampled data (DATA_S, EDGE_S) from the sampler 615, and may generate phase detection signals (UP, DN) for synchronizing the phase of the sampled data (DATA_S, EDGE_S) with the clock signal (DLK_CLK).

The digital loop filter 625 may receive the phase detection signals (UP, DN) from the phase detector 620, and may output a delay signal for increasing or decreasing a delay of the clock signal (DLK_CLK), based on the phase detection signals (UP, DN). According to an embodiment, the second divider 655 may divide a frequency of the clock signal (DLK_CLK) to output the frequency-divided clock signal (DLK_CLK) to the digital loop filter 625.

The phase converter 630 may receive the delay signal from the digital loop filter 625, and may receive the internal clock signal (RX_CLK) from a clock generating circuit. The phase converter 630 may utilize the delay signal to change a phase of the internal clock signal (RX_CLK), and may output the phase-changed internal clock signal (DLK_CLK).

According to an embodiment, when the DQ bit circuit 600 operates in the local loop mode, the phase converter 630 may receive the delay signal from the digital loop filter 625, and may receive the internal clock signal (RX_CLK) received from the EDC bit circuit. The phase converter 630 may utilize the delay signal to change the phase of the internal clock signal (RX_CLK), and may output the phase-changed internal clock signal (DLK_CLK).

Figure 17:
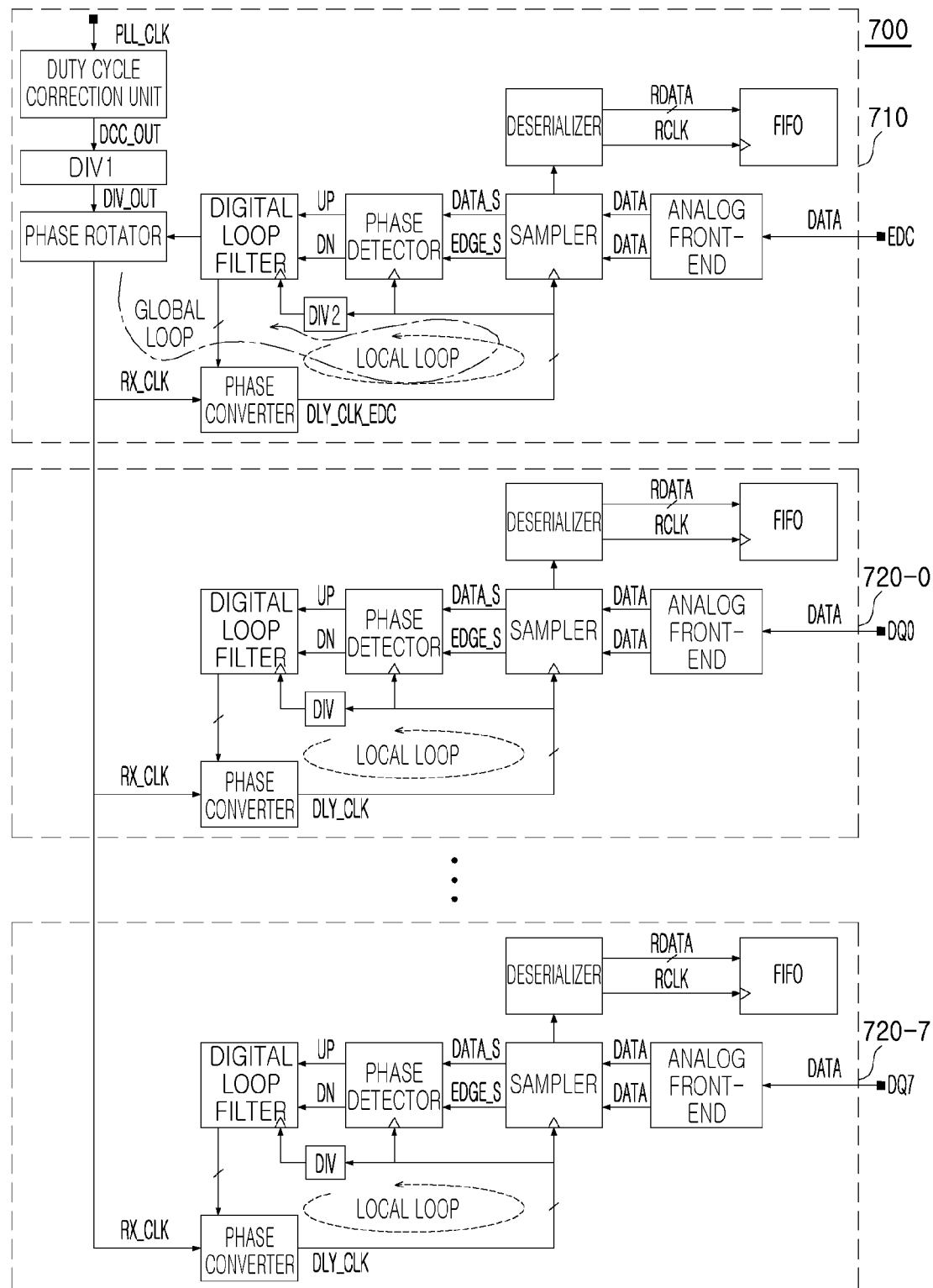
FIG. 17 illustrates a CDR circuit according to an embodiment of the disclosure.
Figure 18:
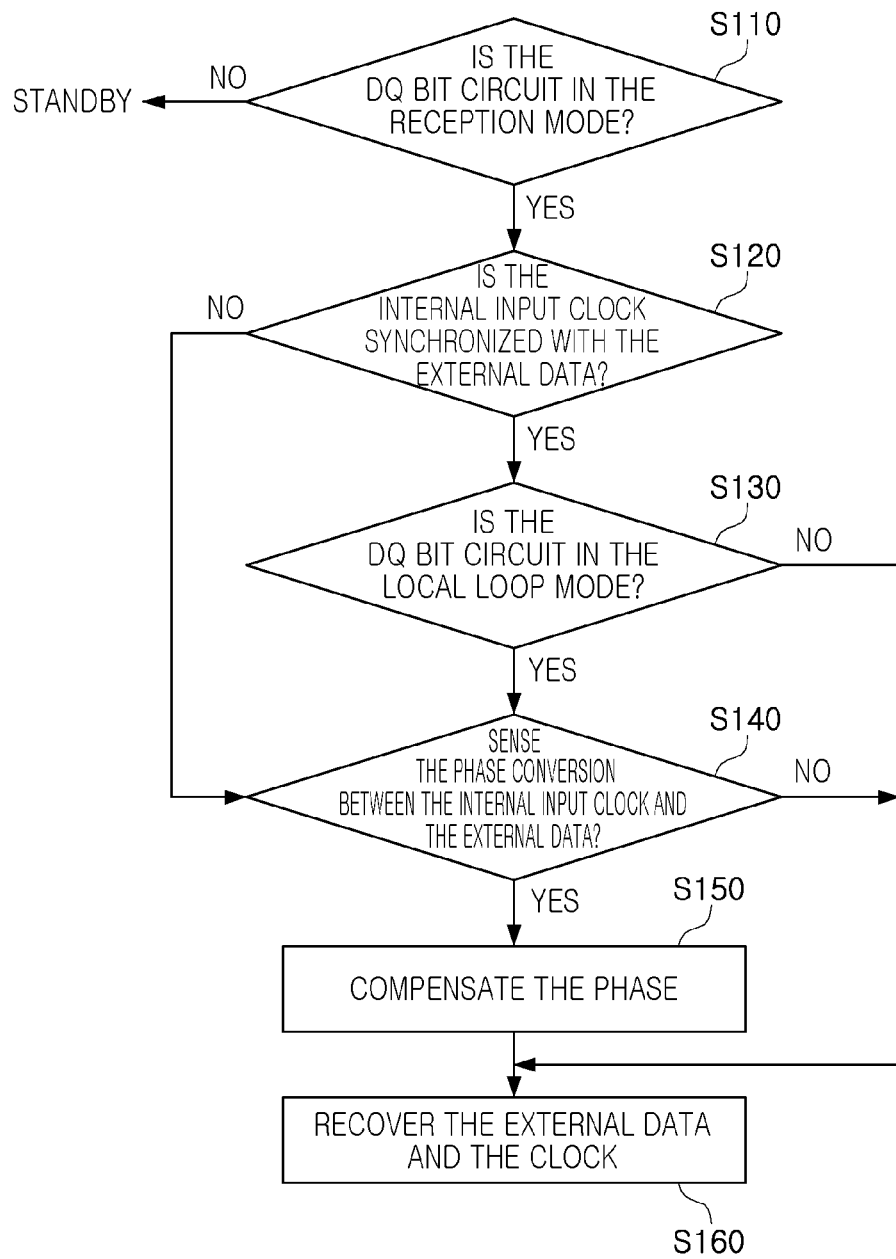
FIG. 18 is a flowchart illustrating an operation of a receiver of a DQ bit circuit according to an embodiment of the disclosure.
Figure 19:
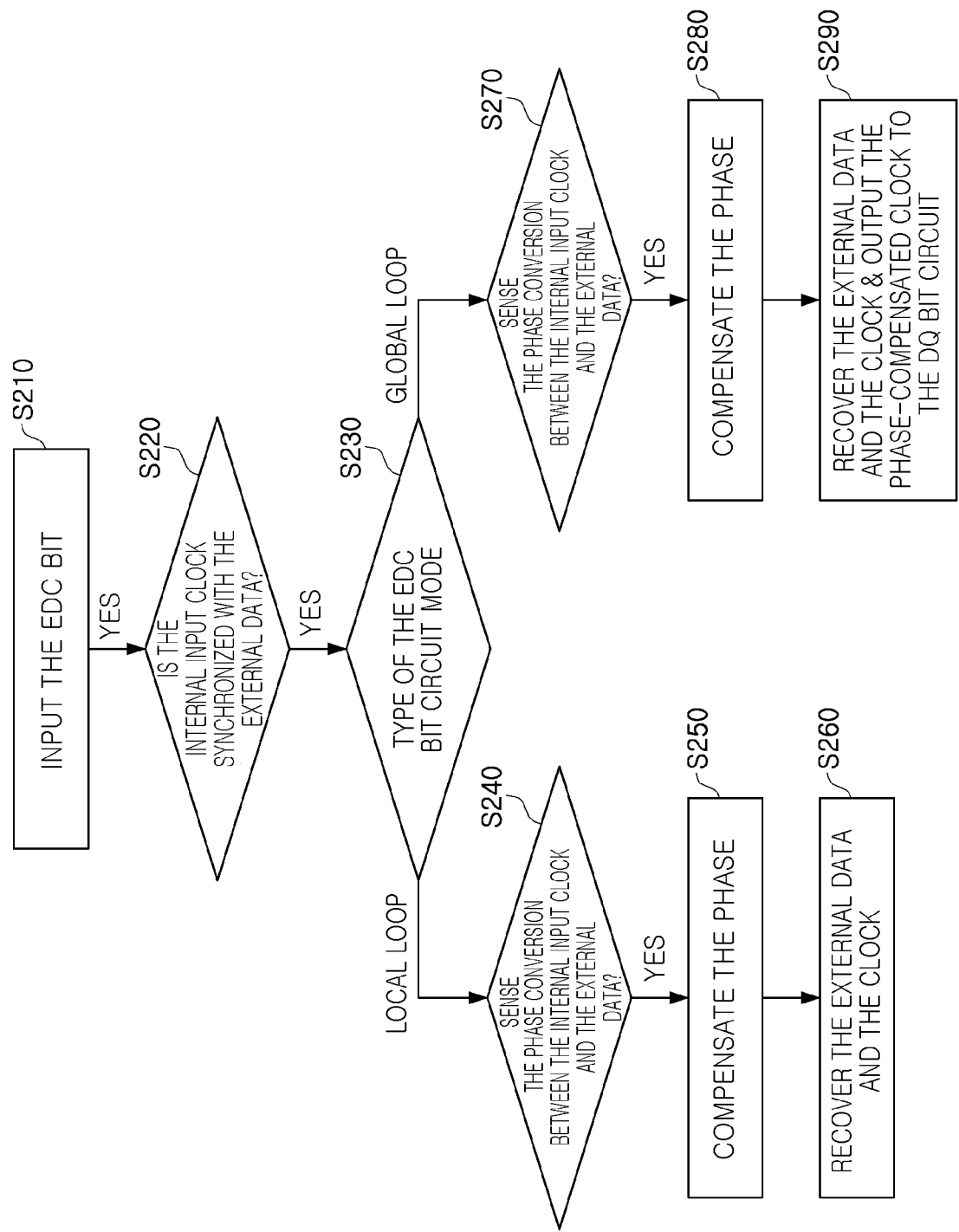
FIG. 19 is a flowchart illustrating an operation of a receiver of an EDC bit circuit according to an embodiment of the disclosure.

FIG. 17 illustrates a CDR circuit according to an embodiment of the disclosure. FIG. 18 is a flowchart illustrating an operation of a receiver of a DQ bit circuit according to an embodiment of the disclosure. FIG. 19 is a flowchart illustrating an operation of a receiver of an EDC bit circuit according to an embodiment of the disclosure.

Referring to FIG. 17, a CDR circuit 700 according to an embodiment of the disclosure may include one EDC bit circuit 710 and eight DQ bit circuits 720-0 to 720-7. A phase rotator of the EDC bit circuit 710 may be connected to a phase converter of the EDC bit circuit 710 and a phase converter of each of the eight DQ bit circuits 720-0 to 720-7.

Referring to FIGS. 17 and 18, a method of operating the receiver of the DQ bit circuit may include determining whether the DQ bit circuit 720-0 is in the reception mode (S110). When the DQ bit circuit 720-0 is not in the reception mode (S110-NO), the DQ bit circuit 720-0 may not receive data from a memory device. The DQ bit circuit 720-0 may sense the phase change of the data of the memory device and the internal clock signal, and may, thus, wait in a standby mode.

When the DQ bit circuit 720-0 is in the reception mode (S110-YES), the method of operating the receiver of the DQ bit circuit may include determining whether the data received from the memory device and the internal clock signal are synchronized (S120). As described above, the synchronization process between the data received from the memory device and the internal clock signal may be performed in the initial training mode.

When the data received from the memory device and the internal clock signal are synchronized (S120-YES), the method of operating the receiver of the DQ bit circuit may include determining whether the DQ bit circuit 720-0 is in the local loop mode (S130). The DQ bit circuit 720-0 may receive the internal clock signal (RX_CLK) from the EDC bit circuit 710.

When the DQ bit circuit 720-0 is not in the local loop mode (S130-NO), the DQ bit circuit 720-0 may not check whether a phase difference has occurred between the data received from the memory device and the internal clock signal, and the internal clock signal (RX_CLK) received from the EDC bit circuit 710 may be utilized to recover the data received from the memory device and the clock synchronized with the data (S160).

When the DQ bit circuit 720-0 is in the local loop mode (S130-YES), the method of operating the receiver of the DQ bit circuit may include sensing whether a phase difference has occurred between the data received from the memory device and the internal clock signal (RX_CLK) (S140).

When the data received from the memory device and the internal clock signal are not properly synchronized in the training mode (S120-NO), the DQ bit circuit 720-0 does not determine whether the DQ bit circuit 720-0 is in the local loop mode, but may immediately check the phase change (S140).

When a phase difference is sensed between the data received from the memory device and the internal clock signal (RX_CLK) (S140-YES), the DQ bit circuit 720-0 may control the phase of the internal clock signal (RX_CLK) to compensate for the phase difference (S150). The DQ bit circuit 720-0 may utilize the phase-controlled clock signal to recover data received from the memory device and a clock synchronized with the data (S160).

When no phase difference is sensed between the data received from the memory device and the internal clock signal (RX_CLK) (S140-NO), the DQ bit circuit 720-0 may utilize the clock signal, without controlling the phase of the internal clock signal (RX_CLK), to recover data received from the memory device and a clock synchronized with the data (S160).

Referring to FIGS. 17 and 19, because the EDC bit circuit 710 always receives the EDC from the memory device, in a different manner to the DQ bit circuit 720-0, there is no determination whether the EDC bit circuit 710 is in the reception mode. When the EDC is input to the EDC bit circuit 710 (for example, when the power is turned on) (S210), the EDC bit circuit 710 may determine whether the data received from the memory device and the clock signal generated from the clock signal generator are synchronized with each other (S220).

When the data received from the memory device and the clock signal have been synchronized, the EDC bit circuit 710 may determine whether a mode of the EDC bit circuitry 710 is the local loop mode or the global loop mode. When the EDC bit circuit 710 is in the local loop mode, the operation of a receiver of an EDC bit circuit may include sensing whether a phase difference has occurred between the data received from the memory device and the internal clock signal (S240).

When a phase difference is sensed between the data received from the memory device and the internal clock signal, the phase converter of the EDC bit circuit 710 may control the phase of the clock signal to compensate for the phase difference (S250). The EDC bit circuit 710 may utilize the phase-controlled clock signal to recover the data received from the memory device and the clock synchronized with the data (S260). The phase rotator of the EDC bit circuit 710 may output the clock signal generated from the clock signal generator to the DQ bit circuits 720-0 to 720-7.

When the EDC bit circuit 710 is in the global loop mode, the operation of a receiver of an EDC bit circuit may include sensing whether a phase difference has occurred between the data received from the memory device and the internal clock signal (S270).

When a phase difference is sensed between the data received from the memory device and the internal clock signal, the phase rotator of the EDC bit circuit 710 may control the phase of the clock signal to compensate for the phase difference (S280). The EDC bit circuit 710 may utilize the phase-controlled clock signal to recover the data received from the memory device and the clock synchronized with the data (S290).

The phase rotator of the EDC bit circuit 710 may output the phase-controlled clock signal to the phase converter of the EDC bit circuit 710 and the phase converter of each of the DQ bit circuits 720-0 to 720-7, respectively (S290). Each of the DQ bit circuits 720-0 to 720-7 may utilize the clock signal output from the EDC bit circuit 710 to recover the data received from the memory device and the clock synchronized with the data (S290).

Figure 20:
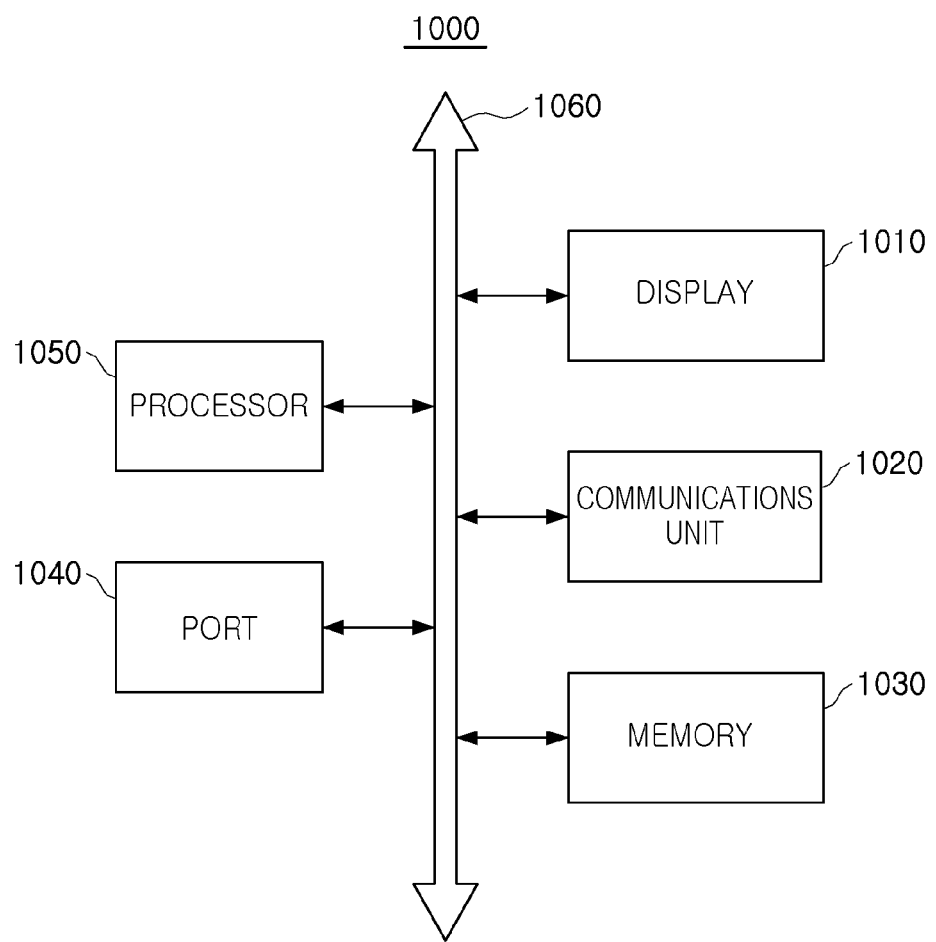
FIG. 20 is a block diagram illustrating an electronic device including a memory device according to an embodiment of the disclosure.

FIG. 20 is a view illustrating an electronic device including a memory device according to an embodiment of the disclosure.

An electronic device 1000 according to an embodiment illustrated in FIG. 20 may include a display 1010, a communications unit 1020, a memory 1030, a port 1040, and a processor 1050. Components such as the display 1010, the communications unit 1020, the memory 1030, the port 1040, and the processor 1050 may communicate with each other via at least one bus 1060. In addition to the above-described components, the electronic device 1000 may further include a power supply unit, a sensor unit, various input/output units, and the like.

The processor 1050 may control specific operations, commands, tasks, and the like of the electronic device 1000. The processor 1050 may be a central processing unit (CPU), a microprocessor unit (MCU), an application processor (AP), and the like, and may be connected to other units, such as the display 1010, the communications unit 1020, the memory 1030, the port 1050, or the like, through the bus 1060.

Referring to FIG. 20, the memory 1030 may be provided as a single memory device, or in a memory package form including a plurality of memory devices. The memory 1030 may be in accordance with various embodiments of the disclosure described above with reference to FIGS. 1 to 19.

The disclosure is not limited to the above-described embodiments and the accompanying drawings. It will be understood to those skilled in the art that various changes in form and details may be made therein without departing from the spirit and scope of the disclosure.

According to an embodiment of the disclosure, the memory controller may compensate for the phase difference between the data input from the memory device and the clock signal in the controller by using the EDC, which may be reliably received from the memory device. Therefore, the phase difference occurring at the receiving terminal of the memory controller may be dynamically sensed in real time, and all receivers may be simultaneously compensated for the sensed phase difference at once.

The various and advantageous advantages and effects of the disclosure may be not limited to the above description, and may be more easily understood in the course of describing a specific embodiment of the disclosure.

While the disclosure has been shown and described with reference to example embodiments thereof, it will be apparent to those skilled in the art that modifications and variations could be made thereto without departing from the scope of the disclosure as defined by the appended claims.

What is claimed is:

1. A memory controller comprising:
    an error detection code (EDC) bit circuit configured to receive an EDC from a memory device and recover the EDC based on a first internal clock signal;
    a data bit circuit configured to receive data from the memory device, and recover the data based on a second internal clock signal; and
    a phase rotator configured to receive a first delay signal from the EDC bit circuit, control a phase of an input clock signal based on the first delay signal, and generate a phase-controlled input clock signal as the first internal clock signal;
    wherein the data bit circuit receives the first internal clock signal from the phase rotator, changes a phase of the first internal clock signal based on a second delay signal, and generates a phase-changed first internal clock signal as the second internal clock signal.

2. The memory controller according to claim 1, wherein the EDC bit circuit comprises:
    a sampler configured to sample the EDC based on the input clock signal;
    a phase detector configured to receive the sampled EDC from the sampler, and generate a phase detection signal for synchronizing phases of the EDC and the input clock signal based on the sampled EDC; and
    a digital loop filter configured to receive the phase detection signal from the phase detector, and generate the first delay signal for increasing and decreasing a delay of the input clock signal based on the phase detection signal.

3. The memory controller according to claim 2, wherein the EDC bit circuit further comprises:
    a phase converter configured to receive the first internal clock signal from the phase rotator, and
    wherein the sampler receives the first internal clock signal from the phase converter, and samples the EDC based on the first internal clock signal.

4. The memory controller according to claim 1, wherein when the EDC bit circuit operates in a global loop mode, the phase rotator outputs the first internal clock signal, and
    wherein when the EDC bit circuit operates in a local loop mode, the phase rotator outputs the input clock signal.

5. The memory controller according to claim 4, wherein the EDC bit circuit comprises:
    a phase converter configured to receive the input clock signal from the phase rotator when the EDC bit circuit operates in the local loop mode, and
    wherein the phase converter changes the phase of the input clock signal based on the first delay signal, and generates a phase-changed input clock signal as the first internal clock signal.

6. The memory controller according to claim 5, wherein when the EDC bit circuit operates in the global loop mode, the phase converter receives the first internal clock signal from the phase rotator.

7. The memory controller according to claim 4, wherein when the EDC bit circuit operates in the local loop mode, the data bit circuit receives the input clock signal from the phase rotator, change the phase of the input clock signal based on the second delay signal, and generates a phase-changed input clock signal as the second internal clock signal.

8. A memory controller comprising:
a first data receiving circuit configured to receive first data from a memory device and recover the first data based on a first internal clock signal;
at least one second data receiving circuit configured to receive second data from the memory device, and recover the second data based on a second internal clock signal; and
a phase rotator configured to receive a first delay signal from the first data receiving circuit, control a phase of an input clock signal based on the first delay signal, and generate a phase-controlled input clock signal as the first internal clock signal;
wherein the first data receiving circuit generates the first delay signal for synchronizing phases of the first data and the input clock signal, and
wherein the at least one second data receiving circuit receives the first internal clock signal from the phase rotator, and generates the second internal clock signal based on the first internal clock signal.

9. The memory controller according to claim 8, wherein the at least one second data receiving circuit receives the first internal clock signal from the phase rotator, changes a phase of the first internal clock signal based on a second delay signal, and generates a phase-changed first internal clock signal as the second internal clock signal.

10. The memory controller according to claim 8, wherein the first data receiving circuit comprises:
a first sampler configured to sample the first data based on the input clock signal;
a first phase detector configured to receive the sampled first data from the first sampler, and generate a first phase detection signal for synchronizing the phases of the first data and the input clock signal based on the sampled first data; and
a first digital loop filter configured to receive the first phase detection signal from the first phase detector, and generate the first delay signal for increasing and decreasing a delay of the input clock signal based on the first phase detection signal.

11. The memory controller according to claim 10, wherein the first data receiving circuit further comprises:
a first phase converter configured to receive the first internal clock signal from the phase rotator, and
wherein the first sampler receives the first internal clock signal from the first phase converter, and samples the first data based on the first internal clock signal.

12. The memory controller according to claim 10, wherein the at least one second data receiving circuit comprises:
a second sampler configured to sample the second data based on the second internal clock signal;
a second phase detector configured to receive the sampled second data, and generate a second phase detection signal for synchronizing phases of the second data and the second internal clock signal based on the sampled second data;
a second digital loop filter configured to receive the second phase detection signal from the second phase detector, and generate a third delay signal for increasing and decreasing a delay of the second internal clock signal based on the second phase detection signal; and
a second phase converter configured to receive the third delay signal from the second digital loop filter, control the phase of the second internal clock signal based on the third delay signal, and generate a phase-controlled second internal clock signal as a third internal clock signal.

13. The memory controller according to claim 8, wherein the first data receiving circuit receives the first data from the memory device while the memory controller operates in one of a transmission mode and a reception mode, and
wherein the at least one second data receiving circuit receives the second data from the memory device while the memory controller operates in the reception mode.

14. A memory controller comprising:
a first data receiving circuit configured to receive first data from a memory device and recover the first data based on a first internal clock signal;
at least one second data receiving circuit configured to receive second data from the memory device, and recover the second data based on a second internal clock signal; and
a phase rotator configured to receive a first delay signal from the first data receiving circuit, control a phase of an input clock signal based on the first delay signal, and generate a phase-controlled input clock signal as the first internal clock signal;
wherein when the first data receiving circuit operates in a global loop mode, the at least one second data receiving circuit receives the first internal clock signal from the phase rotator, and generates the second internal clock signal based on the first internal clock signal, and
wherein when the first data receiving circuit operates in a local loop mode, the at least one second data receiving circuit receives the input clock signal from the phase rotator, and generates the second internal clock signal based on the input clock signal.

15. The memory controller according to claim 14, wherein the first data receiving circuit comprises:
a phase converter configured to receive the input clock signal from the phase rotator, control the phase of the input clock signal based on the first delay signal, and generate the phase-controlled input clock signal as the first internal clock signal when the first data receiving circuit operates in the local loop mode.

16. The memory controller according to claim 15, wherein when the first data receiving circuit operates in the global loop mode, the phase converter receives the first internal clock signal from the phase rotator.

17. The memory controller according to claim 14, wherein the first data receiving circuit comprises:
a phase converter configured to receive the first internal clock signal from the phase rotator, and control a phase of the first internal clock signal based on a second delay signal when the first data receiving circuit operates in a mode in which both a global loop and a local loop operate, and
wherein the first data receiving circuit recovers the first data based on the phase-controlled first internal clock signal.

18. The memory controller according to claim 17, wherein the first delay signal is for synchronizing phases of the first data and the input clock signal, and
wherein the second delay signal is a signal for synchronizing phases of the first data and the first internal clock signal.

19. The memory controller according to claim 14, wherein the at least one second data receiving circuit controls a phase of the first internal clock signal based on a third delay signal, and generates a phase-controlled first internal clock signal as the second internal clock signal.

20. The memory controller according to claim 19, wherein the third delay signal is a signal for synchronizing phases of the second data and the first internal clock signal.

* * * * *